(12) United States Patent
Otake

(10) Patent No.: US 6,629,300 B1
(45) Date of Patent: Sep. 30, 2003

(54) CAD SYSTEM FOR AN ASIC

(75) Inventor: Toshikazu Otake, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 230 days.

(21) Appl. No.: 09/626,448

(22) Filed: Jul. 26, 2000

(30) Foreign Application Priority Data

Jul. 27, 1999 (JP) .......................................... 11-212115

(51) Int. Cl.$^7$ ................................................ G06F 9/45

(52) U.S. Cl. ......................................................... 716/8

(58) Field of Search ............................... 716/7, 8, 9, 10

(56) References Cited

FOREIGN PATENT DOCUMENTS

| JP | 2-249254 | 10/1990 |
|---|---|---|
| JP | 3-205872 | 9/1991 |
| JP | 6-45438 | 2/1994 |
| JP | 6-268064 | 9/1994 |
| JP | 7-134732 | 5/1995 |
| JP | 11-145289 | 5/1999 |

OTHER PUBLICATIONS

Shi, J. et al., "Macro block based floorplanning", Jan. 1997, IEEE, pp. 21–26.*
Dai, W.W.–M., "Hierarchical placement and floorplanning in BEAR", Dec. 1989, IEEE, pp. 1335–1349.*
Schnecke, V. et al., "Hybrid genetic algorithms for constrained placement problems", Nov. 1997, IEEE, pp. 266–277.*
Upton, M. et al., "Inetgrated placement for mixed marco cell and standard cell designs", Jun. 1990, IEEE, pp. 32–35.*
Japanese Office Action dated Aug. 6, 2001, with partial English translation.

* cited by examiner

Primary Examiner—John F. Niebling
Assistant Examiner—Stacy A Whitmore
(74) Attorney, Agent, or Firm—McGinn & Gibb, PLLC

(57) ABSTRACT

A CAD system defines a higher-integrated area in a whole internal cell area, arranges a flexible macro block within the higher-integrated area, change the site definition of the area for the flexible macro block from a first definition for receiving higher-integrated logic gates to a second definition for receiving higher-speed logic gates, separately arranges and interconnects logic gates in respective areas, changes the arrangement and interconnections in the respective areas based on evaluation of electric characteristics in the respective area, to obtain embedded LSI having a higher-integrated circuit section and a higher-speed circuit section.

18 Claims, 24 Drawing Sheets

CAD SYSTEM FOR AN ASIC

BACKGROUND OF THE INVENTION (a) Field of the Invention

The present invention relates to a CAD (computer aided design) system for designing an ASIC (application specific integrated circuit) and, more particularly, to a CAD system which is capable of reducing a turn around time (TAT) for the design of an ASIC.

(b) Description of a Related Art

In a fabrication process for a semiconductor device such as ASIC, the technique for designing a system-on-chip LSI including therein a plurality of ICs integrated on a single chip is highlighted. In the field of LSIs for the communication use, the demands for integrating or embedding a higher-speed IC operating with a smaller voltage amplitude or a higher-resolution IC having a higher resolution and a higher-integrated IC operating at a lower speed in a single chip have drastically increased.

Examples of the higher-speed ICs include a logic circuit operating with a low voltage differential signaling (LVDS) and a current mode logic circuit (CML). Examples of the higher-integrated ICs include a CMOS device, which operates with a higher voltage amplitude between source potentials and consumes extremely small current during a waiting mode thereof.

Demands have also increased for designing the embedded LSI including the higher-speed IC and the higher-integrated IC with a smaller TAT. The embedded LSI generally includes in the higher-speed IC a plurality of basic cells each including device elements having a relatively large size, and in the higher-integrated IC a plurality of basic cells each having device elements having a relatively small size and thus occupying a smaller area.

FIG. 1 shows a CAD system used for designing a LSI such as an ASIC (Application Specific Integrated Circuit). The CAD system 11 includes an input section 12, a library storage 13, a data processor 14, a display panel 15 and an output section 16. In the CAD system, the data processor 14 operates for processing based on the circuit data or user data input through the input section 12 and the library data stored in the library storage 13, then generates custom mask pattern data in accordance with the requested specification, and delivers the custom mask pattern data through the output section 16. The custom mask pattern data is generated by using an interactive processing while observing the display panel 15.

FIG. 2 shows a flowchart of designing a macro block in the CAD system of FIG. 1. After data for the macro block are read out in step 412, the size of the macro block, or the number of basic cells to be arranged in row and column directions, is determined based on the read data in step 413, followed by an automated wiring step for designing interconnections in the macro block. The term "macro block" as used herein means a set of basic cells or functional cells operating for a specific function as a whole. The macro block is categorized into two types: a software macro block and a hardware macro block, the latter being capable of handling the logic signals at a higher speed compared to the former.

Examples of the hardware macro block include a first type having basic electric elements such as transistors, resistors and capacitors which are arranged and interconnected, and a second type having basic logic gates such as NANDs, NORs and flipflops in combination which are arranged and interconnected. The hardware macro block is generally implemented by the second type for achieving a higher-speed or higher-resolution operation. The data for hardware macro blocks are stored in the library storage of the CAD system after examination of the electric characteristics thereof including a timing characteristic. The data stored for the macro block in the library includes fixed information for the dimensions and external pins thereof. On the other hand, the data for software macro blocks in the library include interconnections between logic circuits, and does not include locational information for the elements and the interconnections.

In step 414, source lines for the semiconductor chip are fixed by an automated wiring technique, and basic cells are then located in step 415 by an automated arrangement technique, followed by automated wiring step 416 for the functional cells, and a subsequent verification step 417 for verifying the electric characteristics such as a timing characteristic. If the test results for the electric characteristics assure a desired operation, the steps for the macro block design are finished. If not, the process returns to step 412 or 413, for iterative processing for assuring the electric characteristics such as timings.

FIG. 3 shows a flowchart of a chip design in the CAD system of FIG. 1. In step 422, the macro block designing process of FIG. 2 is first conducted, then followed by input of the data for the semiconductor chip in step 423. In step 424, one or a plurality of hardware macro blocks are forcibly or manually arranged in a higher-integrated area.

In step 425, source lines for the chip are arranged by automated wiring, followed by automated arrangement of functional cells in the higher-integrated area in step 426, and automated wiring of signal interconnections between the functional cells in step 427. In step 428, electric characteristics of the resultant chip such as a timing characteristic are examined. If the test results assure the desired operation, the chip design is finished. If not, the process returns to step 422, 423 or 424 for iterative processing until desired characteristics can be obtained.

FIGS. 4 and 5 are detailed schematic flowcharts of a process shown in FIG. 2. After the process starts, interconnection information (netlist) 712 for the macro block, pin-arrangement information 713 and an automated arrangement/interconnection library 714 are read from the storage. In step 715, the size and shape of the hardware macro block are then determined for achieving a higher-speed operation based on the netlist 712, pin-arrangement information 713 and library 714, to obtain array information 716. FIG. 6 shows an example of the arrangement of resistors and bipolar transistors in one of the functional cells specified by the array information 716.

Subsequently, in step 717, source bus line information is added to the array information 716 of the hardware macro block by using an automated arrangement/wiring tool for the macro blocks, to thereby obtain enhanced array information 718. In step 719 of FIG. 5, the enhanced array information 718 is further added with data for type "B" (higher-speed) logic cells, which are manually arranged, to thereby obtain macro block arrangement data 720.

FIG. 6 shows the arrangement of a higher-speed (or type "B") logic circuit disposed in a higher-speed area and FIG. 7 shows a circuit diagram for the logic circuit, which includes bipolar transistors and resistors as well as source lines and signal lines. The source lines include VCC source line, VCSI reference line and GND line. The logic circuit is implemented by a differential circuit or an ECL circuit.

Back to FIG. 5, in step 721, automated wiring is conducted in the ECL circuit based on the macro block information 720 to obtain macro block interconnection data 722. If desired interconnections are not obtained by the automated wiring step, a manual wiring function included in the automated arrangement/interconnection tool is used for correction of the interconnections obtained by the automated wiring steps. Then, in step 723, characteristics of the obtained macro blocks are examined based on the macro block interconnection data 722, followed by judgement of the test results in step 724 If it is judged that desired characteristics are obtained in the macro blocks, the process advances to step 725 or 727. If it is judged that desired characteristics are not obtained, the process returns to steps 741 and 742 for judgement whether or not correction in the interconnections is sufficient to allow the resultant macro block to pass the verification.

In step 725, an automated arrangement/interconnection library 726 is then generated based on the macro block interconnection data 22. This library 726 includes information for terminals and interconnection-prohibited area to be used in the automated arrangement/wiring tool as well as artwork information, thereby allowing the hardware macro block to be designed by a common design flow in common with other logic circuits.

In step 727, a delay library 728 is generated based on the circuit data including parasitic capacitances and parasitic resistances and extracted from the macro block interconnection data 722. The delay library 728 includes input/output conditions, delay data and rules for wiring between circuits to be used for a logic simulation. The order of the steps 725 and 727 may be reversed or these steps may be conducted concurrently.

In step 729, the automated arrangement/interconnection library 726 is embedded in the automated arrangement/wiring tool and evaluated therein. If it is judged in step 730 that the library 726 passes the evaluation, the process advances to step 731, and if not, the process advances to step 738. In step 731, libraries 726 and 728 are embedded in the CAD system 11 and evaluated therein. If it is judged in step 732 that libraries 726 and 728 pass the evaluation, the process advances to step 733, wherein libraries 726 and 728 are released from the output section to finish the macro block design. If it is judged in step 732 that libraries 726 and 728 do not pass the evaluation, the process advances to steps 736 and 737 to further judge as to whether a correction in the way of embedding into the CAD system is sufficient for the libraries 726 and 728 to pass the evaluation. If the judgement is affirmative, the process advances to step 735, wherein the way of the embedding into the CAD system 11 is corrected and the steps starting from step 723 are iterated. If the judgement is negative, then the process advances to step 738.

In steps 738 and 739, it is judged whether or not a correction of the library 726 is sufficient to pass the evaluation. If the judgement is affirmative, the process advances to step 740 wherein the library 726 is corrected to iterate the steps starting from step 729. If the judgement is negative, the process advances to steps 741 and 742, wherein correction of the interconnections is sufficient. If the judgement is affirmative, the process advances to step 743, wherein the interconnections are corrected to iterate the steps starting from step 723. If the judgement is negative, the process advances to steps 744 and 745, wherein it is judged whether or not correction in the arrangement of the type "B" logic circuit is sufficient.

In step 745, if the judgement is affirmative, the process advances to step 746, wherein the arrangement of the type "B" logic circuit (ECL circuit) is changed to iterate the steps starting from step 721. If the judgement is negative, the process advances to steps 747 and 748, wherein it is judged whether or not correction in the array information 716 is sufficient. If the judgement is affirmative, the process advances to step 749, wherein the array information 716 is corrected to iterate the steps starting from step 717. If the judgement is negative, the process advances to steps 750 and 751, wherein it is judged whether or not correction in the macro block is sufficient.

If the judgement is affirmative in step 751, the process advances to step 746, wherein the arrangement of the logic circuit is corrected to iterate the steps starting from step 721, whereas if the judgement is negative, the process advances to steps 753 and 754, wherein it is judged whether or not correction in the pin arrangement is sufficient. If the judgement is affirmative, the process advances to step 755, wherein the pin arrangement is corrected to iterate the steps starting from step 714. If the judgement is negative, the process advances to step 756, wherein the automated arrangement/interconnection library 715 is corrected to iterate the steps starting from step 715. It is to be noted that the process succeeding step 735 may be started at any step because the process corresponds to correction processing.

FIGS. 8 and 9 are detailed flowcharts for the chip design process shown in FIG. 3. After the process starts, netlist information 812 for the chip, pin-arrangement information 813 and automated arrangement/interconnection library 714 are read from the library storage. In step 815, macro blocks are forcibly or manually arranged to obtain arrangement data 816 by using the chip automated arrangement/wiring tool based on the netlist information 812, pin-arrangement information 813 and automated arrangement/interconnection library 714.

Subsequently, in step 817, source bus information is added to the arrangement data 816 by using the chip automated arrangement/interconnection tool to obtain enhanced macro block arrangement data 818. In step 819, logic gates are arranged in the enhanced macro block arrangement data 818 by using macro block automated arrangement/wiring tool to obtain chip arrangement data 820.

FIG. 10 shows an example of an functional cell "CA" implemented by a type "A" logic gate, which is capable of being higher integrated, and FIG. 11 shows the circuit diagram therefor. The functional cell CA includes source lines VDD and GND, between which an nMOSFET and a pMOSFET having diffused regions and gate electrodes are disposed. The gate electrodes are made of polysilicon, and the diffused regions may be called "fields".

In step 821, automated wiring is conducted by using chip automated arrangement/wiring tool based on the chip arrangement data 820 to obtain chip arrangement/interconnection data 822. The process then advances to step 823 or 825 for evaluation of characteristics such as a timing characteristic. If desired interconnections are not obtained in the automated wiring step 821, the manual wiring function in the chip automated arrangement/wiring tool is used to correct the data 822. The order of the steps 823 and 825 may be selected arbitrarily or these steps may be conducted concurrently. However, step 823 is in general conducted first because the evaluation for the characteristics of the peripheral areas for the macro blocks are more strict.

In step 823, characteristics of the peripheral area for the macro block are evaluated by using actual interconnections based on the chip arrangement/interconnection data 822. If it is judged in step 824 that desired characteristics are obtained, the process advances to step 827 wherein mask data 828 is generated to finish the chip design process. If the judgement is negative, the process advances to steps 830 and 831, wherein correction in the interconnections is sufficient.

On the other hand, in step 825, characteristics of the type "A" logic circuit are evaluated using actual interconnections based on the arrangement/interconnection data 822 to judge in step 826 whether or not desired characteristics are obtained. If the judgement is affirmative, the process advances to step 827 wherein similar processing is conducted. If the judgement is negative, the process advances to step 830, wherein similar processing is conducted.

If the judgement is affirmative in step 831, the process advances to step 832, wherein the interconnections are corrected to iterate the steps starting from step 822. If the judgement is negative, the process advances to steps 833 and 834 wherein it is judged whether correction in the arrangement of the type "A" logic circuit is sufficient. If the judgement is affirmative in step 834, the process advances to step 835 wherein the arrangement of the type "A" logic circuit is corrected to iterate the steps starting from step 821. If the judgement is negative in step 834, the process advances to steps 836 and 837 wherein it is judged whether or not correction in the arrangement of the macro blocks is sufficient. If the judgement is affirmative in step 837, the process advances to step 838 wherein the arrangement of the macro block is corrected to iterate the steps starting from step 817. If the judgement is negative in step 837, the process advances to steps 839 and 840 wherein it is judged whether or not correction in the netlist is sufficient.

If the judgement is affirmative in step 840, the process advances to step 841, wherein the netlist 812 is corrected to iterate the steps starting from step 815. If the judgement is negative in step 840, the process advances to step 842 and 843 wherein it is judged whether or not correction in the pin arrangement is sufficient. If the judgement is affirmative in step 843, the process advances to step 844 wherein pin arrangement is corrected to iterate the steps starting from step 815. If the judgement is negative, the process advances to step 845 wherein the automated arrangement/interconnection library 814 is corrected to iterate the steps starting from step 815.

It is to be noted that, in the series of steps as described above, since the steps succeeding step 830 are conducted for correction, the order of the steps are not limited to the example as recited above. The correction steps are conducted by using an engineering change order (ECO) function, which allows the execution to be limited to the data to be corrected, by inputting the data before correction and after correction. If desired characteristics are not finally obtained by correction or change in the steps after step 830, the macro block design itself obtained by the netlist 812 is corrected.

In the conventional process, designing the embedded IC having a higher-integrated (type "A") circuit section and a higher-speed (type "B") circuit section is conducted by determining a hardware macro block implementing the higher-speed circuit section, forcibly or manually arranging the hardware macro block within the higher-integrated circuit area, and designing the whole chip area by the flowchart of FIG. 3, to obtain the chip design such as shown in FIG. 12.

In FIG. 12, the designed chip 30 includes a type "A" circuit area as a higher-integrated circuit area, a hardware macro block "HM" as a higher-speed circuit area disposed as a part of the internal cell area and shown by hatching, and I/O cell areas 31 disposed at the outer periphery of the chip. Ring-shaped source line AVR and ground line AGR are disposed as source/ground lines encircling the internal cell area, and ring-shaped source line BVR and ground line BGR are disposed as source/ground lines encircling the hardware macro block.

FIG. 13 shows detailed arrangement of a part of the hardware macro block shown in FIG. 12. The hardware macro block generally includes a plurality of basic cells 33 and 34 in underlying data and a plurality of primitive functional cells 35 in overlying data. The primitive functional cells 35 are generally arranged automatically by the automated arrangement/wiring tool based on the circuit data, whereas the macro block having a higher operational speed or a higher resolution is manually arranged at an optimum location. The hardware macro block "HM" includes a basic cell array, wherein arrangement of a column of basic cells are inverse of that of the adjacent column. The designer inputs circuit data by using a mouse while observing the display panel in FIG. 1 to locate the functional cells 35 prepared beforehand for the macro block. Thus, higher-speed logic gates such as CML are arranged, followed by wiring between the functional cells by using automated wiring technique.

The timing verification between the input terminals and output terminals of the macro block after automated wiring is conducted based on a simulation library of the static timing analysis prepared for the macro block design, while specifying the input terminals of input stage functional cells and the output terminals of output stage functional cells of the macro block. If detailed verification is required, the artwork data is converted to netlist information, circuit data in SPICE format, by a layout parameter extraction tool, and the delays between the inputs and the outputs of the macro block are obtained by comparison.

In the conventional technique for the embedded LSI as described, there is a drawback of a large TAT wherein the design for the embedded LSI is obtained by the two-step design process including the macro block design and the overall chip design. If the chip design involves a defect in a timing verification after the chip arrangement/wiring step, the design for the hardware macro block must be corrected after returning to the initial design stage for the macro block.

Especially in the design for the macro block shown in FIG. 2, the hardware macro block and the library therefor are designed after the floor planning of the chip. In this case, chip size, pin arrangement, terminal location, circuit scale for the higher-speed circuit section, and the location and the arrangement of the hardware macro block must be separately determined for obtaining a higher-speed circuit suited for the type of the embedded LSI.

On the other hand, in the chip design shown in FIG. 3, since the size of the hardware macro block is fixed in the internal area, the optimum locations for the terminals are difficult to obtain. Thus, addition of buffers is generally necessary between the higher-speed circuit section and the input/output buffers or between the higher-speed circuit section and the higher-integrated circuit section for a timing adjustment. The addition of the buffer as well as addition of the interconnections for the buffer increases the design TAT for the product and increases the power dissipation in the embedded LSI.

SUMMARY OF THE INVENTION

It is therefore an object of the present invention to provide a design technique for the embedded LSI, which is capable of designing an optimum circuit arrangement in the embedded LSI for each type of the LSI and reducing the design TAT for the development of the embedded LSI.

The present invention provides a method for designing a LSI by using a CAD system including the steps of defining an internal cell area on a chip, the internal cell area having a first site definition for receiving a first-type logic cells, disposing a flexible macro block in a first area of the internal cell area based on flexible macro block information, changing a site definition of the first area from the first site definition to a second site definition for receiving a second-type logic cells, arranging respective logic cells in the first area for the flexible macro block and in a second area of the internal cell area in accordance with the second site definition and the first site definition, respectively, forming interconnections between the basic cells to form a first circuit section and a second circuit section, respectively, from the first area for the flexible macro bock and the second area, separately evaluating electric characteristics of the first circuit section and the second circuit section, and separately correcting the first circuit section and the second circuit section based on results of the evaluation and correction of.

In accordance with the method of the present invention, the design for arrangement/interconnections of the logic gates can be conducted parallel to each other, with minor corrections including changing the site definitions between the first site definition and the second site definition based on the change of the arrangement of the flexible macro block, which is changed based on the results of evaluation of the electric characteristics of the flexible macro block and the vicinity thereof.

PREFERRED EMBODIMENTS OF THE INVENTION

Before describing preferred embodiments of the present invention, the gate array and CBIC techniques for the ASIC will be described for a better understanding of the present invention. The gate array technique is also called master slice technique, wherein circuit elements are formed on the chip area before the design by a user. After the user determines his own design, the circuit elements are interconnected by overlying interconnect layers. On the other hand, the CBIC technique does not use such master slice and designs for each specific type of the LSI, after the user determines his own design.

The CBIC technique, however, uses existing designs of the macro blocks each having a higher function or the original macro blocks designed for the user, and combines such macro blocks on a single chip. Thus, the CBIC technique designs in a smaller TAT and with a smaller man power compared to the full-custom IC which separately designs the entire IC chip.

Figure 1:
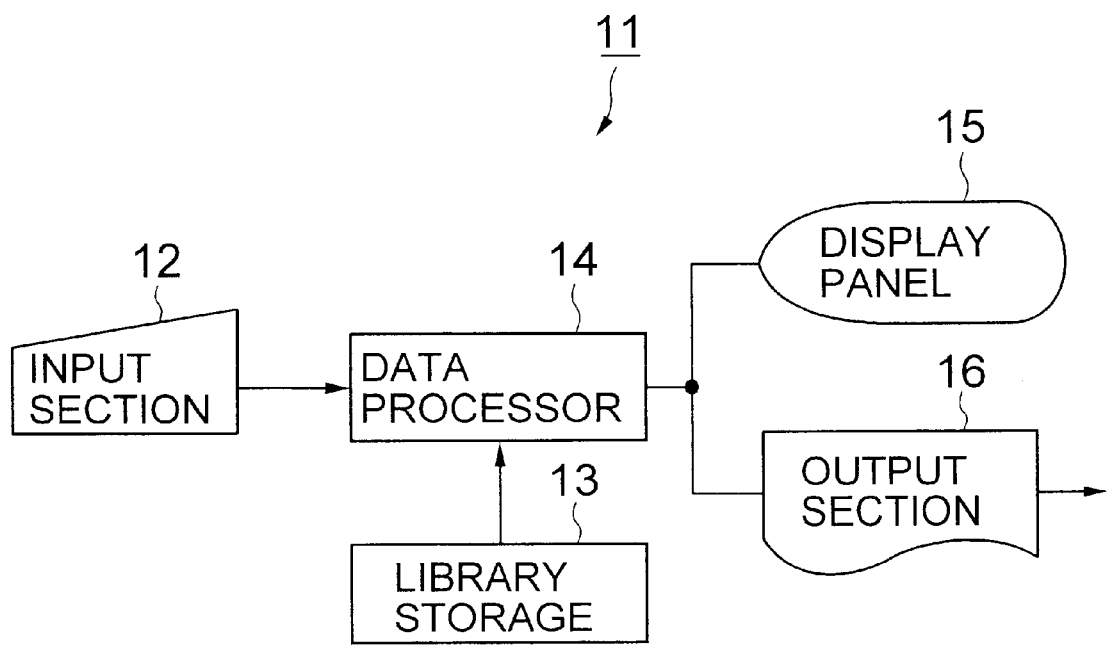
FIG. 1 is a block diagram of a CAD system using a conventional method.
Figure 2:
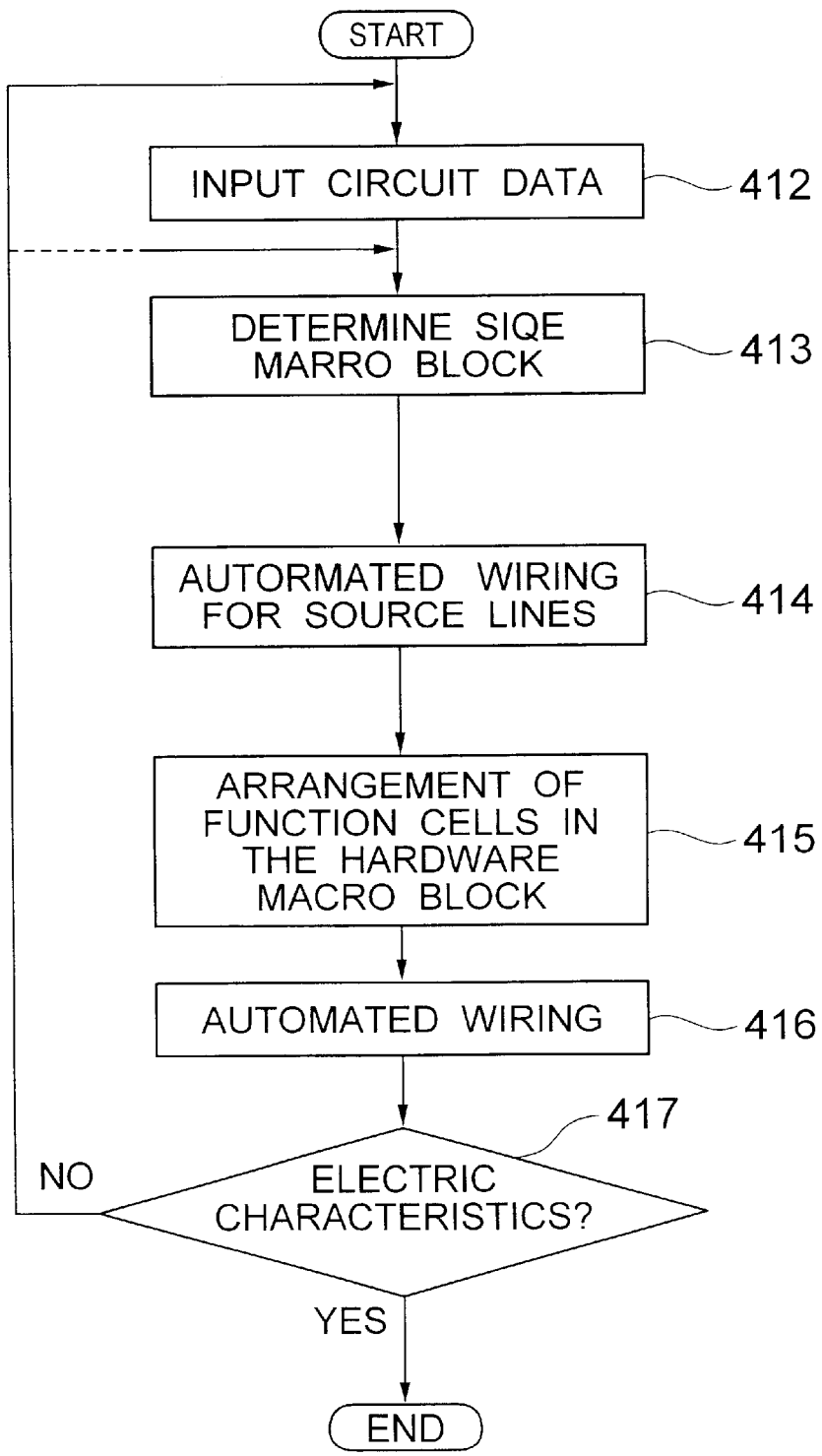
FIG. 2 is a flowchart of a conventional design procedure for a macro block.
Figure 3:
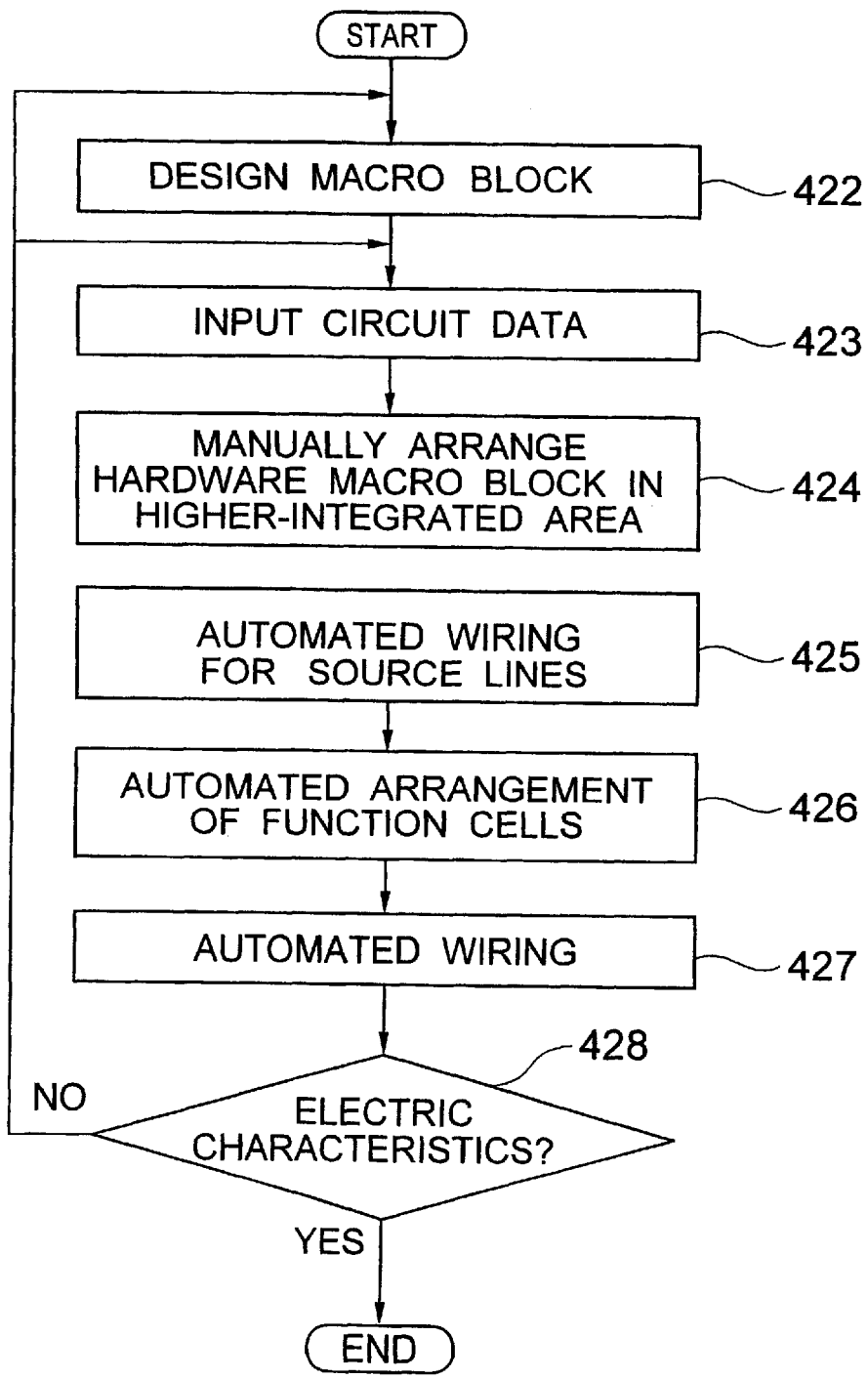
FIG. 3 is a flowchart of a conventional chip design procedure.
Figure 4:
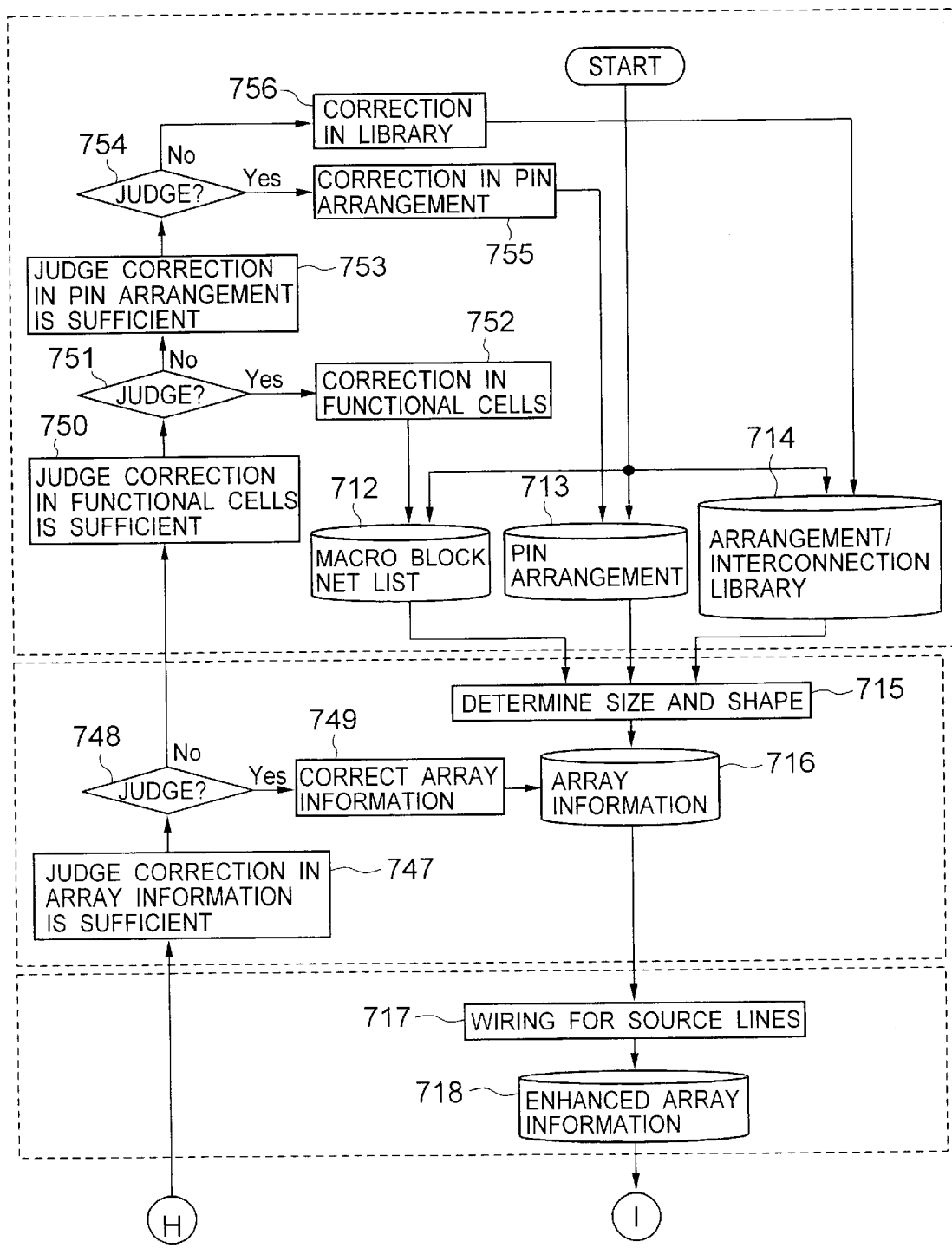
FIG. 4 is a part of a detailed flowchart of the conventional design procedure of FIG. 2.
Figure 5:
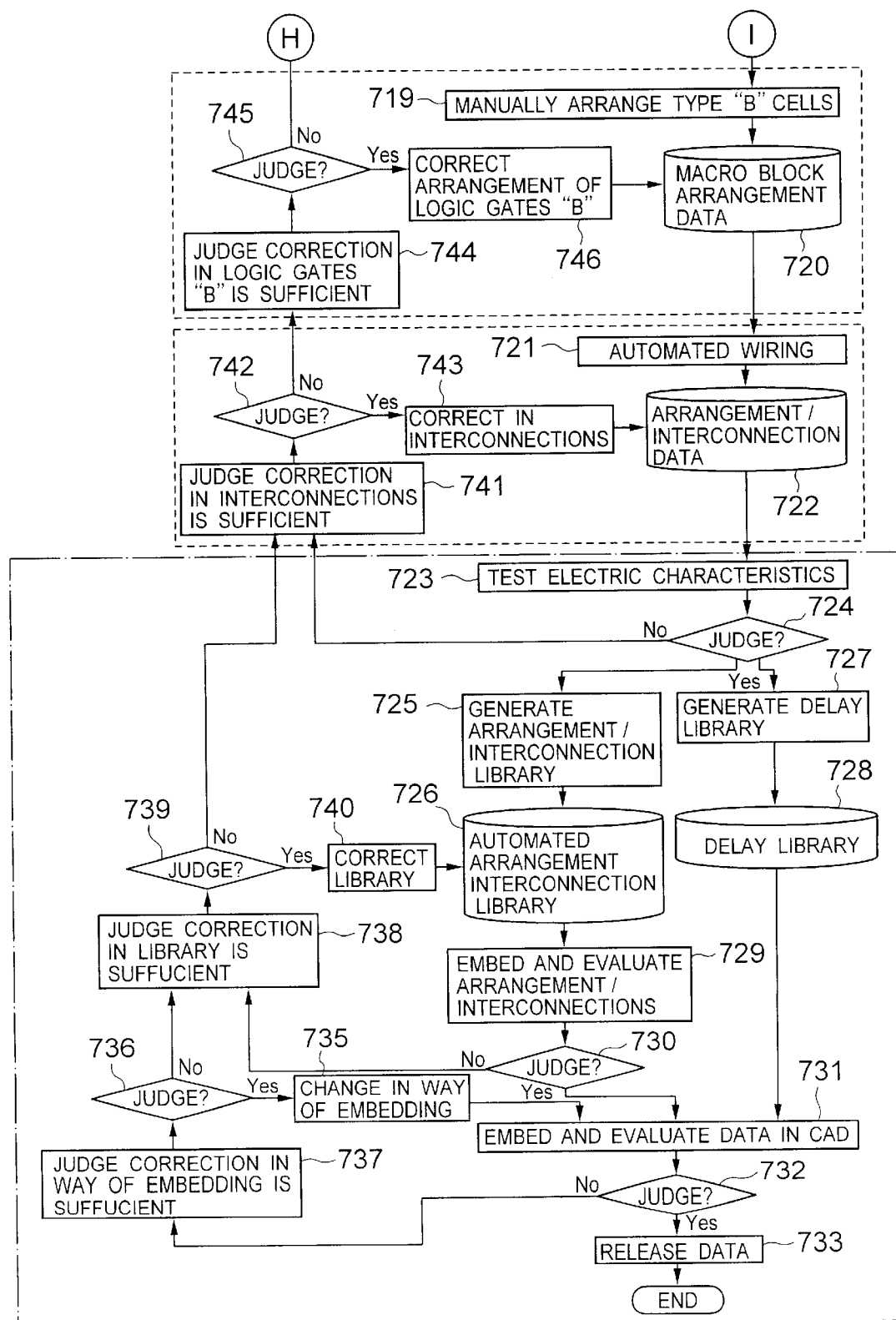
FIG. 5 is another part of the detailed flowchart of the conventional design procedure of FIG. 2.
Figure 6:
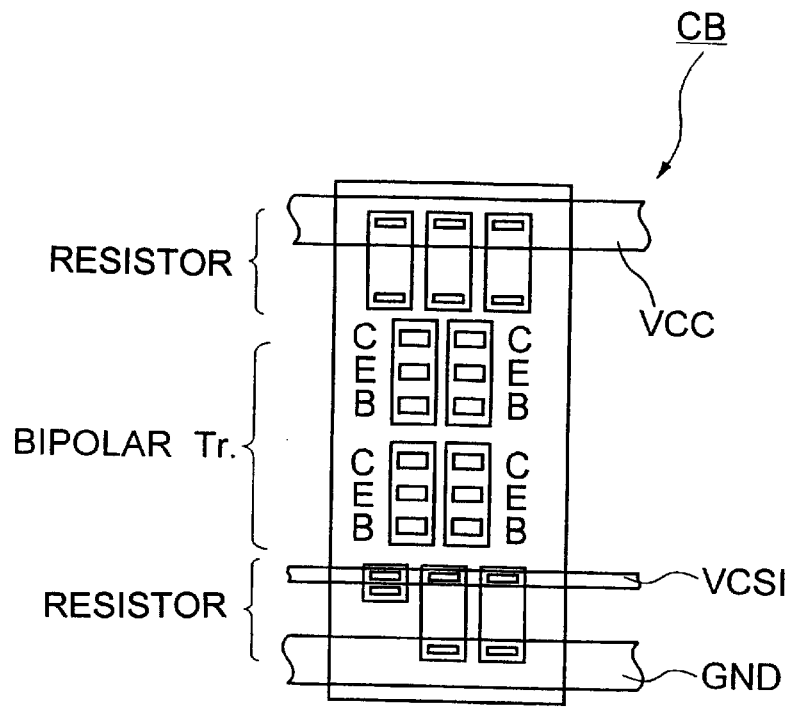
FIG. 6 is a top plan view of a designed functional cell.
Figure 7:
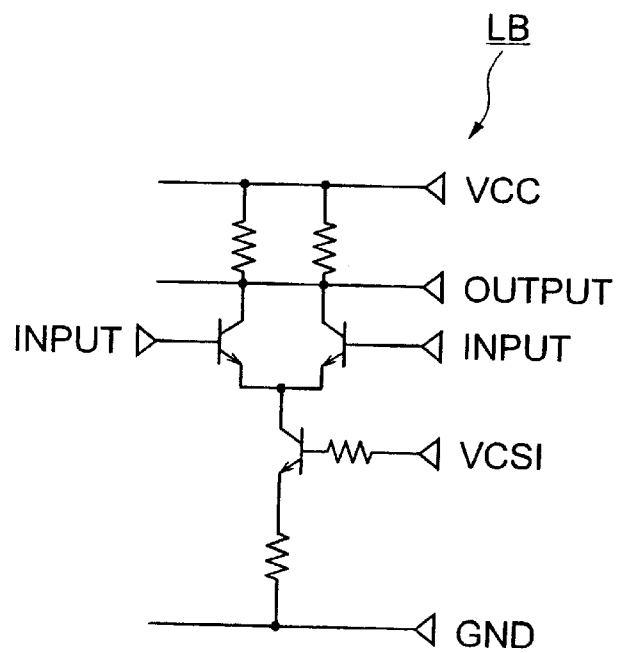
FIG. 7 is a top plan view of an example of a logic cell.
Figure 8:
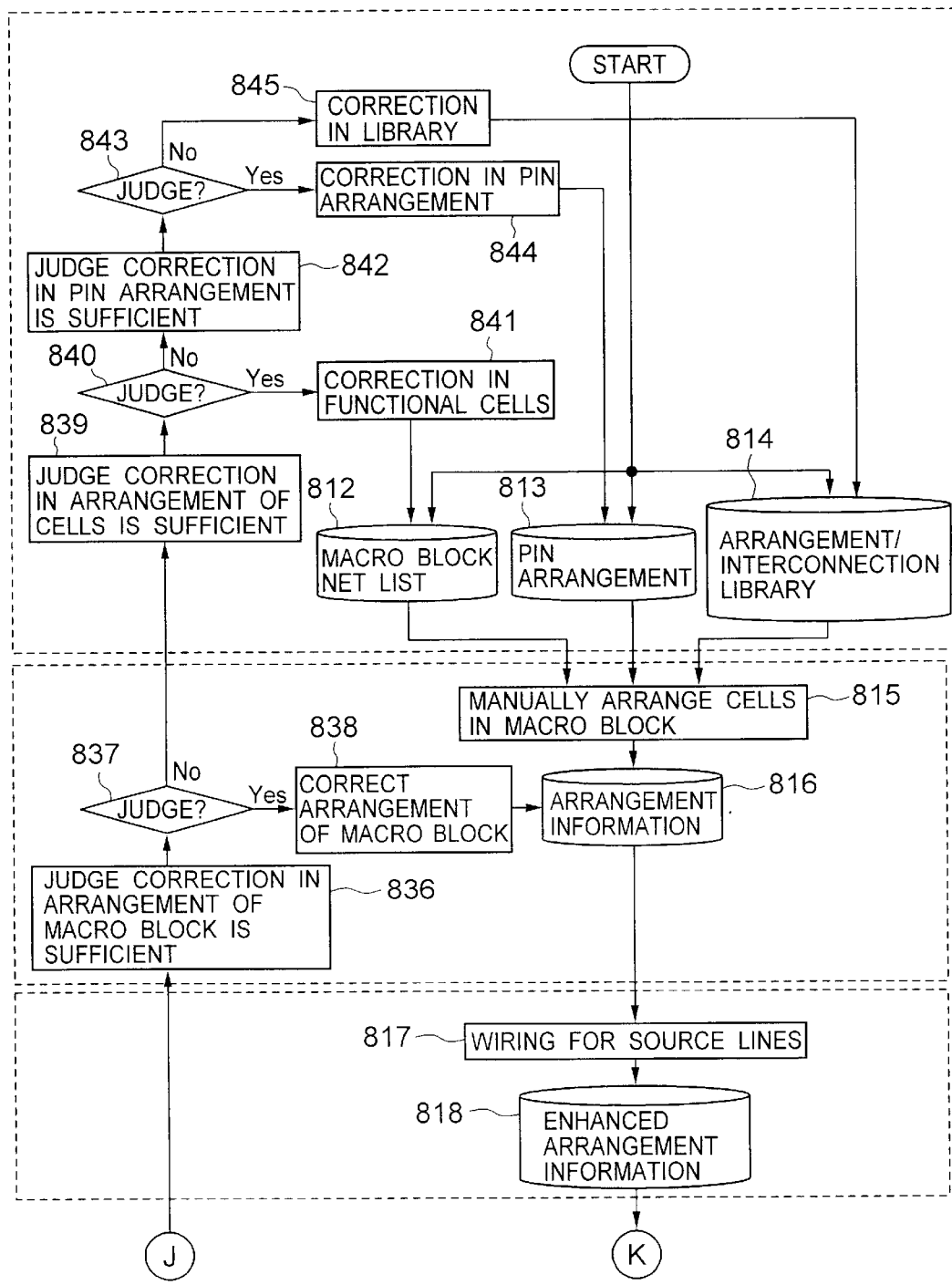
FIG. 8 is a part of a detailed flowchart of the conventional chip design procedure of FIG. 3.
Figure 9:
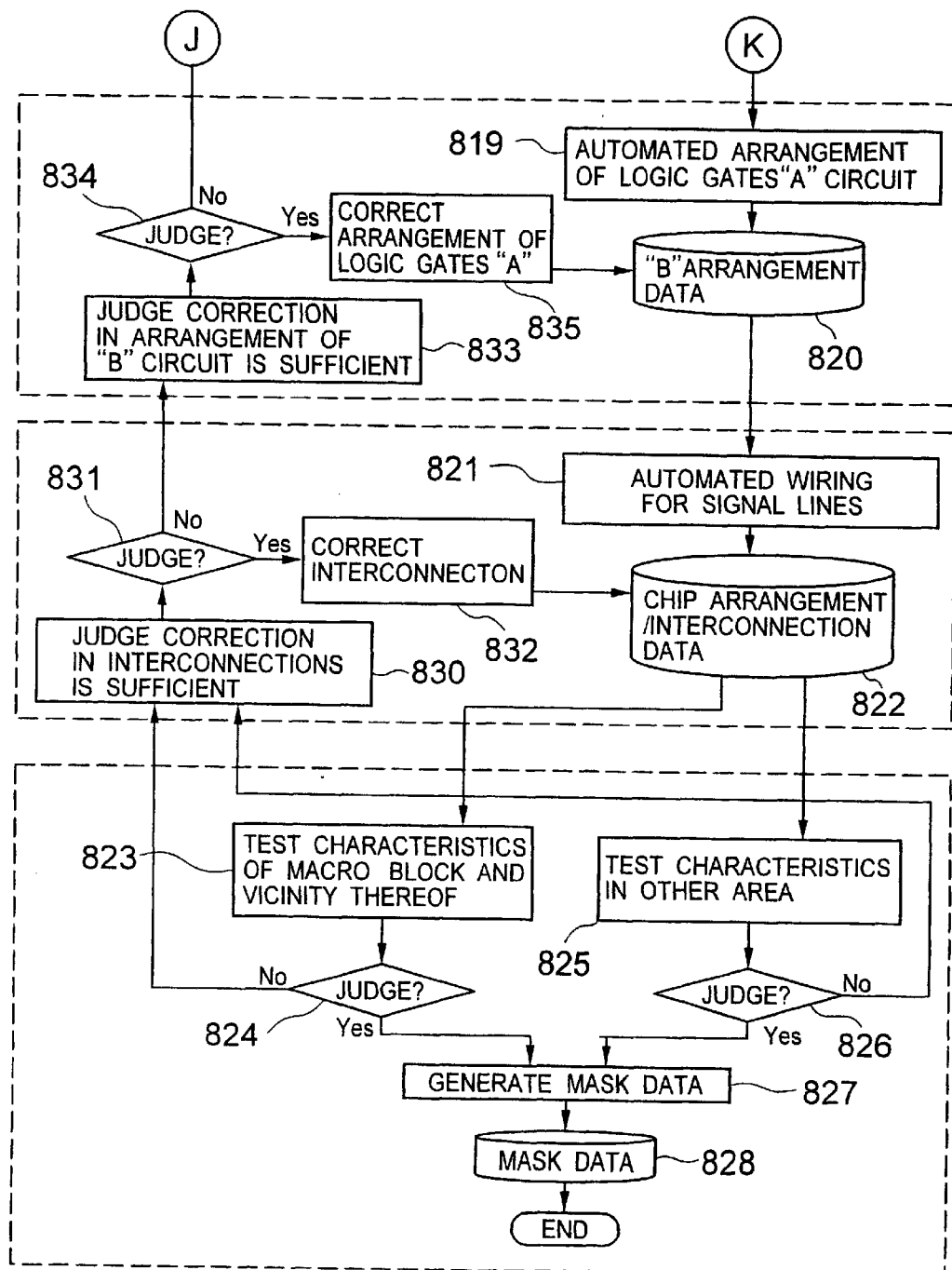
FIG. 9 is another part of the detailed flowchart of the conventional chip design procedure of FIG. 3.
Figure 10:
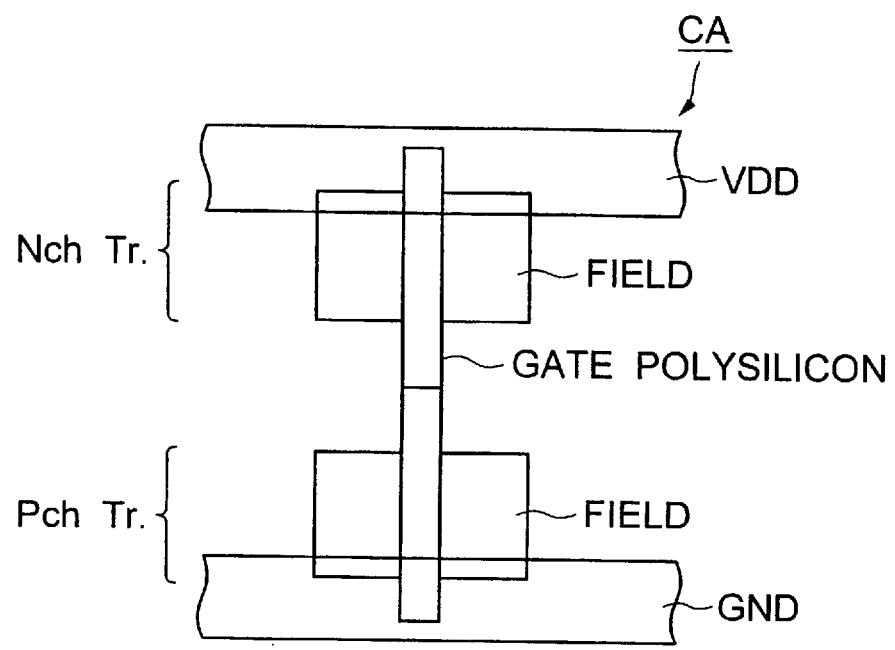
FIG. 10 is a top plan view of an example of a layout data of a functional cell.
Figure 11:
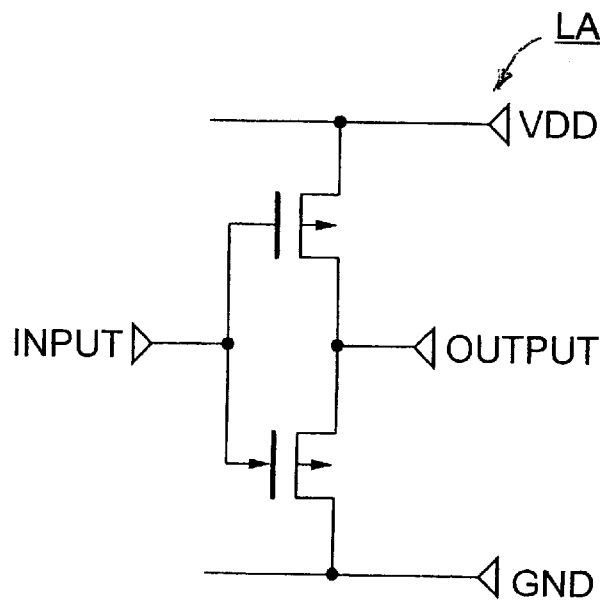
FIG. 11 is a circuit diagram of the functional cell of FIG. 10.
Figure 12:
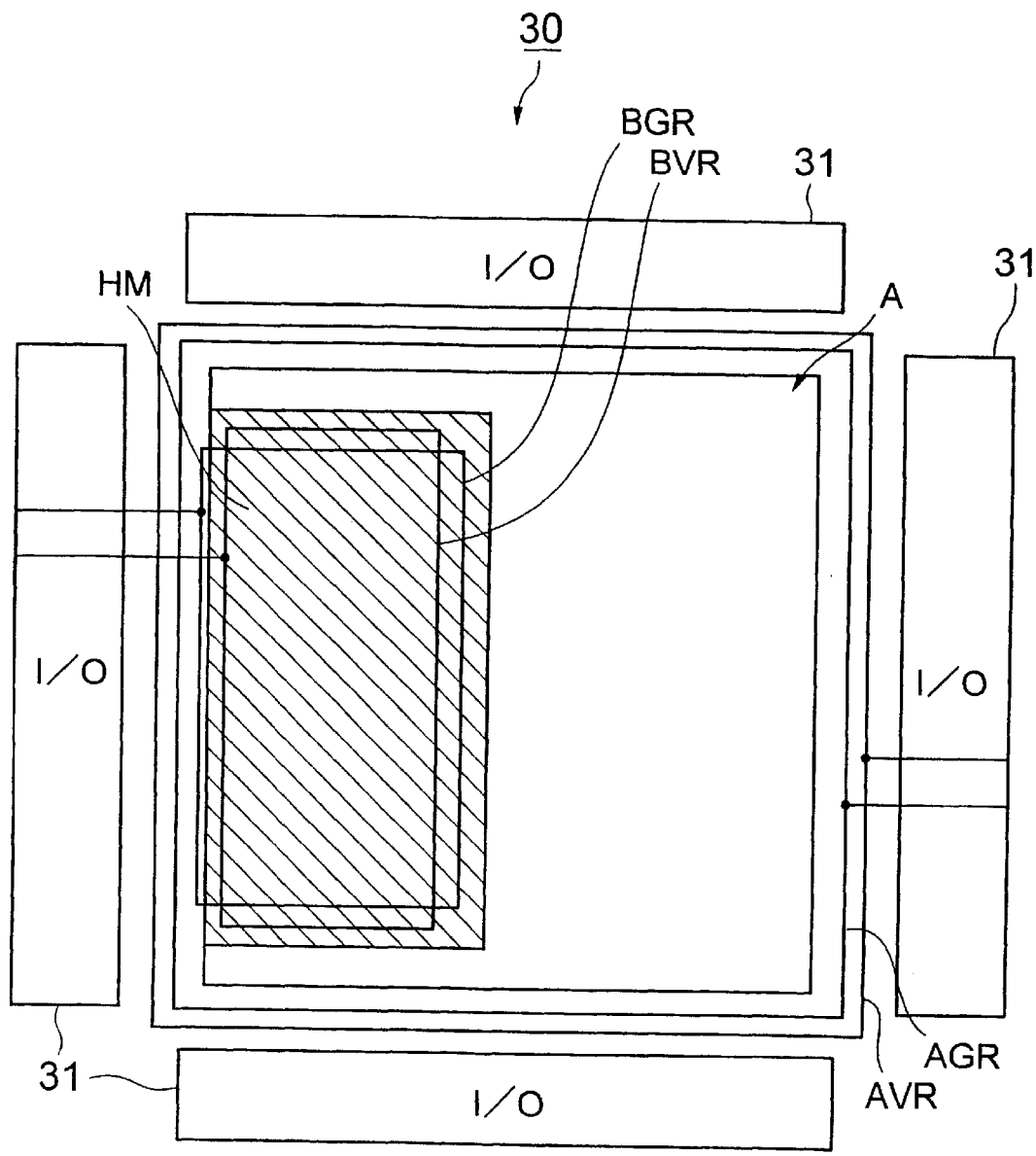
FIG. 12 is a top plan view of a chip designed by the conventional procedure.
Figure 13:
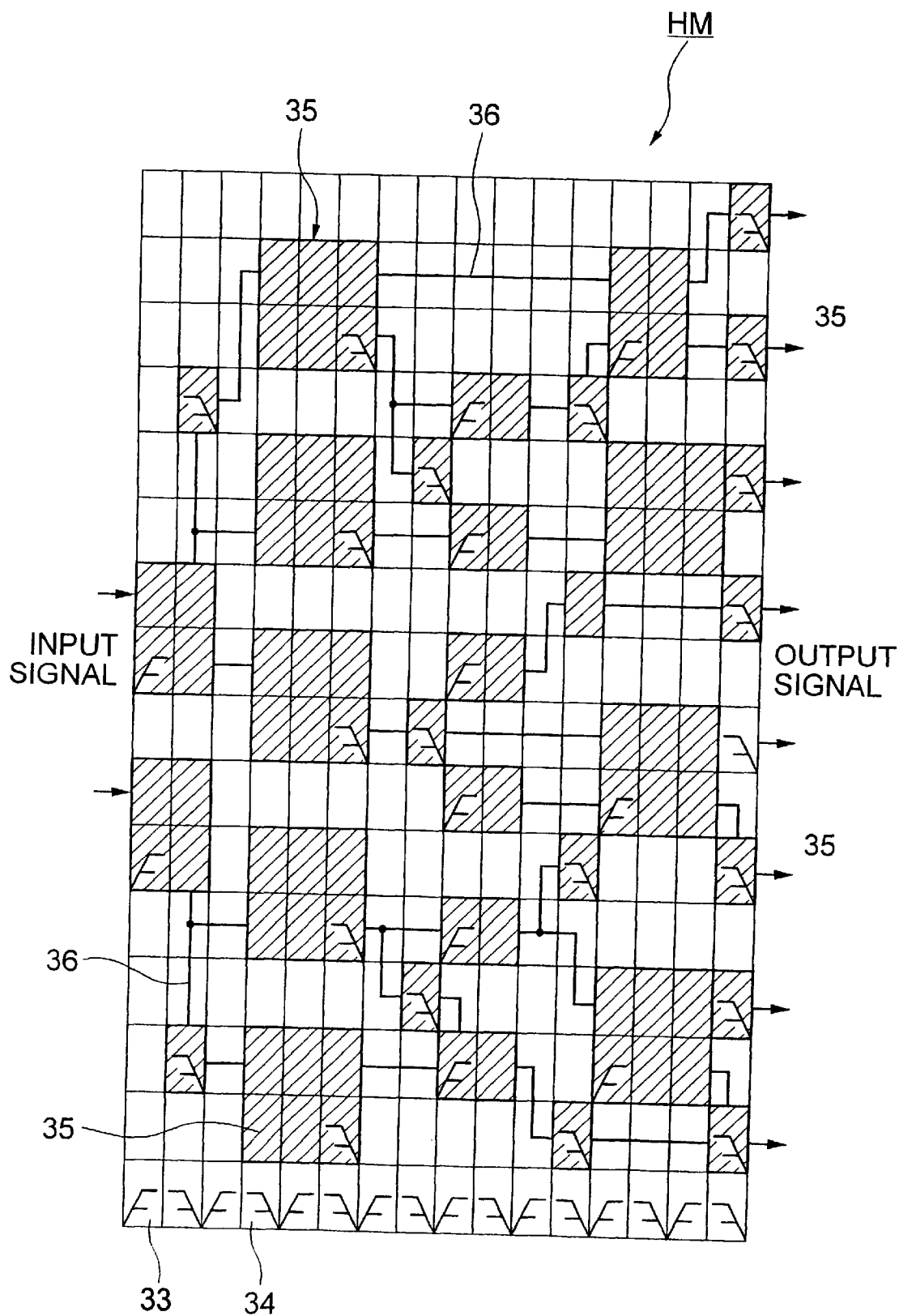
FIG. 13 is a schematic top plan view of a hardware macro block designed by the conventional procedure.
Figure 14:
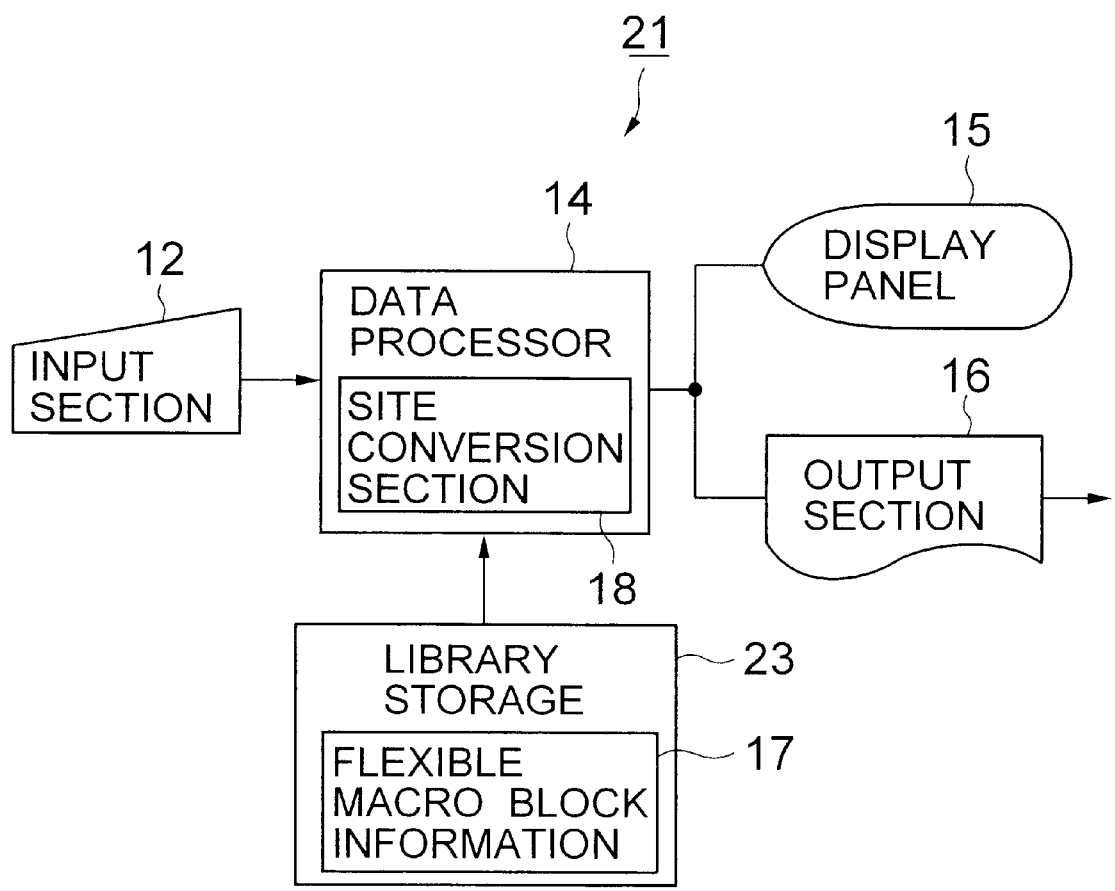
FIG. 14 is a block diagram of a CAD system using a method according to an embodiment of the present invention.

Referring to FIG. 14, a CAD system, generally designated by numeral 21, according to an embodiment of the present invention is similar to the CAD system of FIG. 1 except that the data processor 14 includes therein an site conversion section 18, and that the library storage 23 stores therein flexible macro block information 17. The site conversion section 18 changes the type of the functional cells arranged in each area during the arrangement/wiring step by changing the site definition or area definition which is part of the library information describing the types of the functional cells to be arranged in the area.

In the CAD system 21 of FIG. 14, the entire chip area is initially defined as a higher-integrated area. After the chip netlist information is supplied through the input section 12, a flexible macro block is manually arranged within the higher-integrated area based on the automated arrangement/interconnection library and the flexible macro block information 17 stored in the library storage 23. This is conducted using the data processor 14 in an interactive mode while observing the display panel 15. Subsequently, the site definition of the area for the flexible macro block is changed by the site conversion section 18 from the higher-integrated area to a higher-speed area, whereby the line pitch, unit grid size etc. are changed for achieving a higher operational speed. Higher-speed logic gates are then arranged in the flexible macro block area based on the specification to obtain a custom mask pattern, the data of which is delivered through the output section 16. The flexible macro block information 17 stored in the library storage 23 includes netlist, interconnection-prohibited area, and the shape and size of the basic cells.

In general, data for some types of hardware macro blocks are generated by a technique used for generating software macro blocks, wherein internal functional cells and interconnections are fixed. The technique for the software macro block is different from the technique for an ordinary hardware macro block wherein separate cells are arranged and interconnected manually. In the present embodiment, the technique for the software macro blocks is used for the design of the higher-speed area, by employing the flexible macro block instead of the ordinary hardware macro block.

The term "flexible macro block" as used herein is a macro block having a flexible size for securing the area for the hardware macro block in the chip area. The flexible macro block is disposed in the higher-integrated area by specifying the number of columns and the number of rows as a default based on the flexible macro block data, and the area is converted to a higher-speed area by the site conversion section 17. The flexible macro block technique as used herein allows designing the hardware macro block concurrently with the design of the other chip area. By employing a plurality of basic cell libraries to be used for the flexible macro block, a plurality of libraries for the different types of hardware macro blocks are not necessary.

Figure 15:
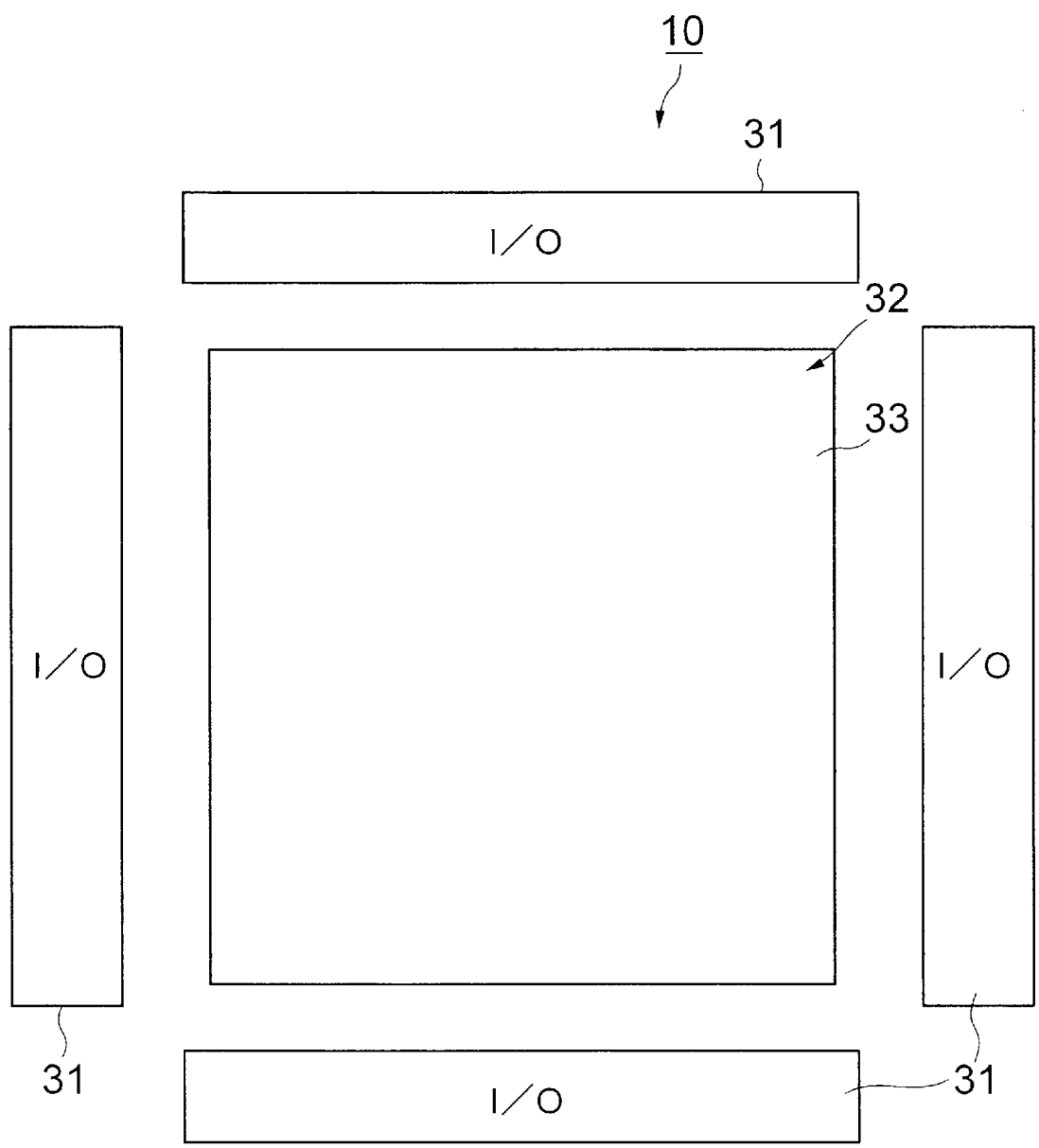
FIGS. 15 to 18 are top plan views of a chip, consecutively showing the procedure of the design using the CAD system of FIG. 14.

FIGS. 15 to 18 show consecutive steps of arrangement in the chip area by using arrangement/interconnection technique according to the present embodiment. As shown in these drawings, the chip area 10 includes an internal cell area 32 and a plurality of I/O cell areas 31 disposed in the peripheries of the chip area. In FIG. 15, a type "A" higher-integrated area having an array of basic cells is disposed in the whole internal cell area 32. In general, logic gates can be arranged without specific limitation in the higher-integrated area because the lengths of the interconnections have less restriction. On the other hand, the arrangement of the functional cells in the higher-speed area is generally restricted to be located in the vicinity of the I/O cell areas 31 because the interconnections between the functional cells and the I/O cells should have smaller lengths due to a smaller propagation delay allowed. Description of FIGS. 15 to 18 will be made below together with the process by the CAD system.

Figure 19:
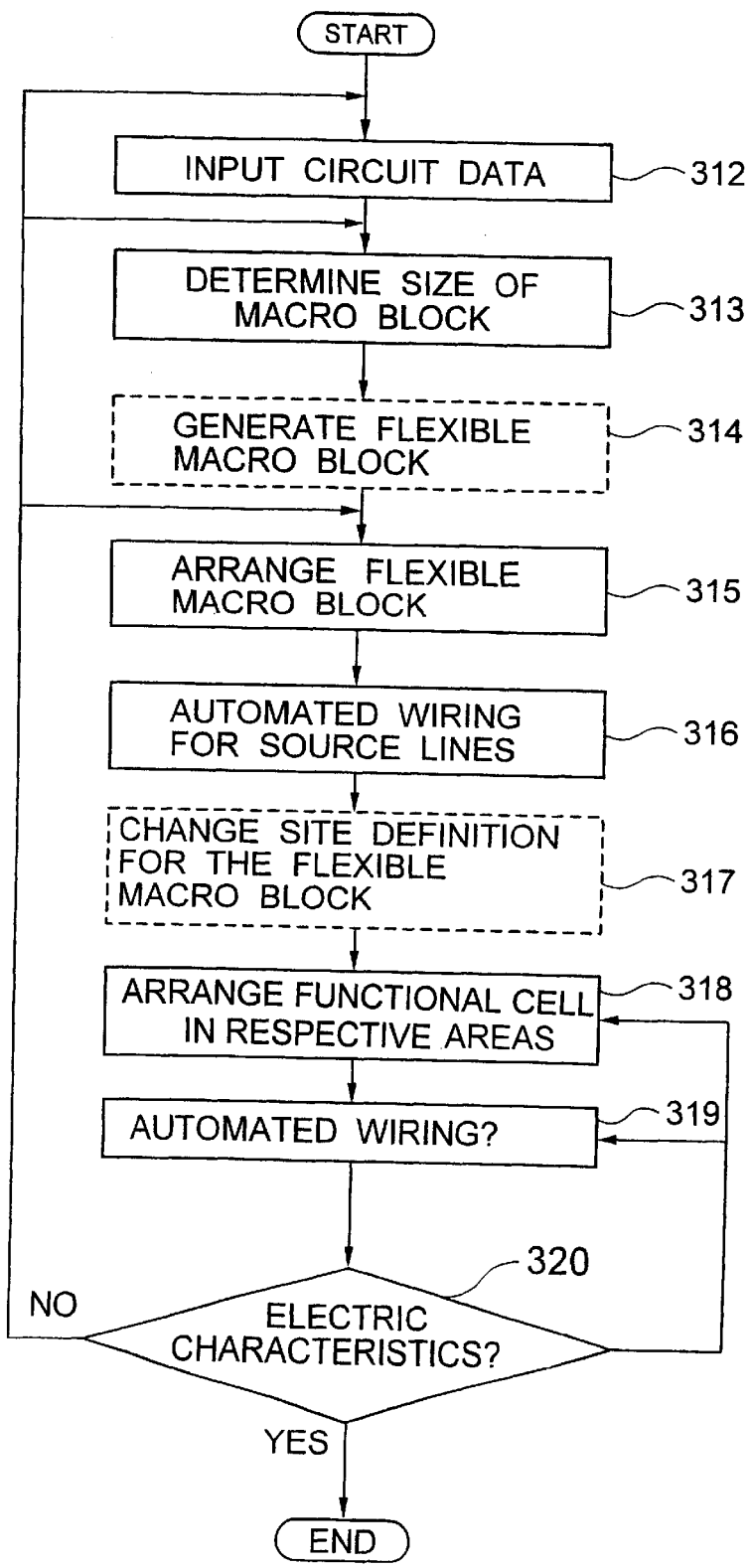
FIG. 19 is a flowchart of a chip design procedure using the CAD system of FIG. 14.

Referring additionally to FIG. 19, an arrangement/wiring process for achieving a CBIC chip by using the CAD system of FIG. 14 includes consecutive steps 312 to 320.

Figure 16:
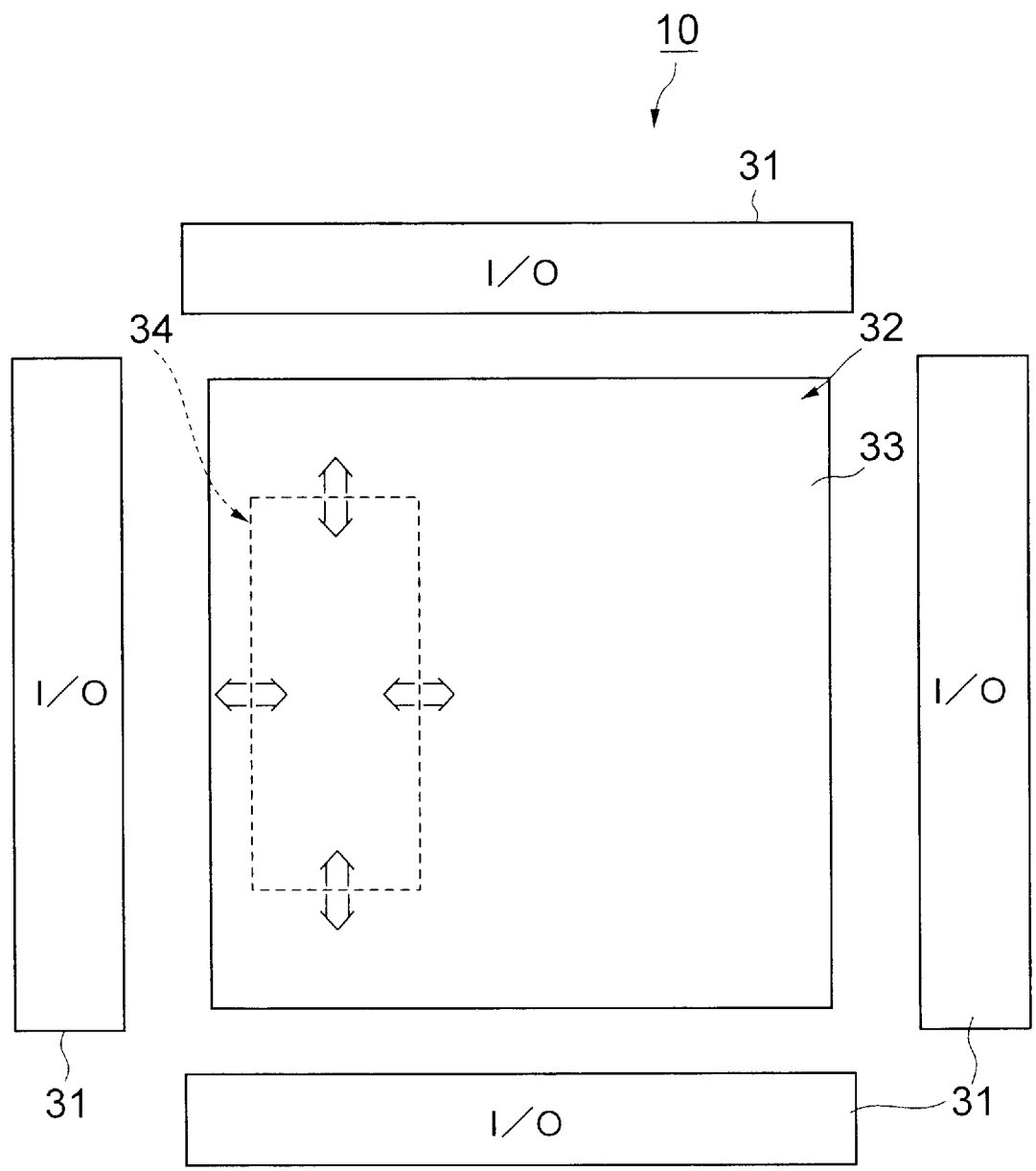

In step 312, circuit data are input through the input section 12, and the type "A" higher-integrated area 32 and the I/O cell areas 31 are determined in the whole chip area. In step 313, the data processor 14 automatically determines the shape and the size of the flexible macro block 34 based on the input data and the description of the site definition which defines that the flexible macro block to be arranged is a type "B" higher-speed circuit. Thereafter, in steps 314 and 315, the flexible macro block 34 is disposed in the internal cell area 32 by manual operation, as shown in FIG. 16. In an alternative, the size of the flexible macro block may be determined manually by the operator instead of the automated design.

Figure 17:
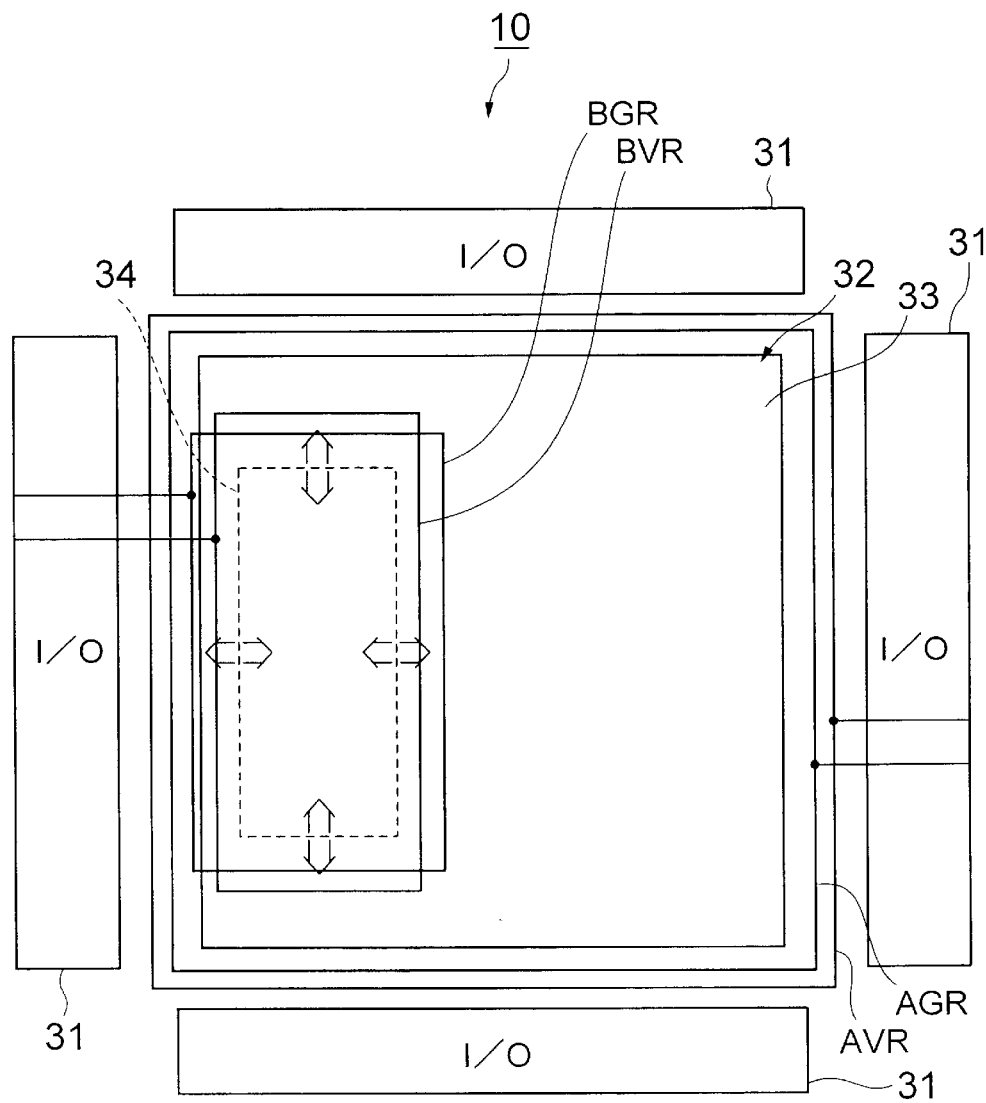

In step 316, ring AVR line and ring AGR line are disposed to encircle the higher-integrated area 32 as VDD line and GND line for the chip, whereas ring BVR line and ring BGR line are disposed to encircle the flexible macro block 34, as shown in FIG. 17, as VDD line and GND line for the flexible macro block 34.

Figure 18:
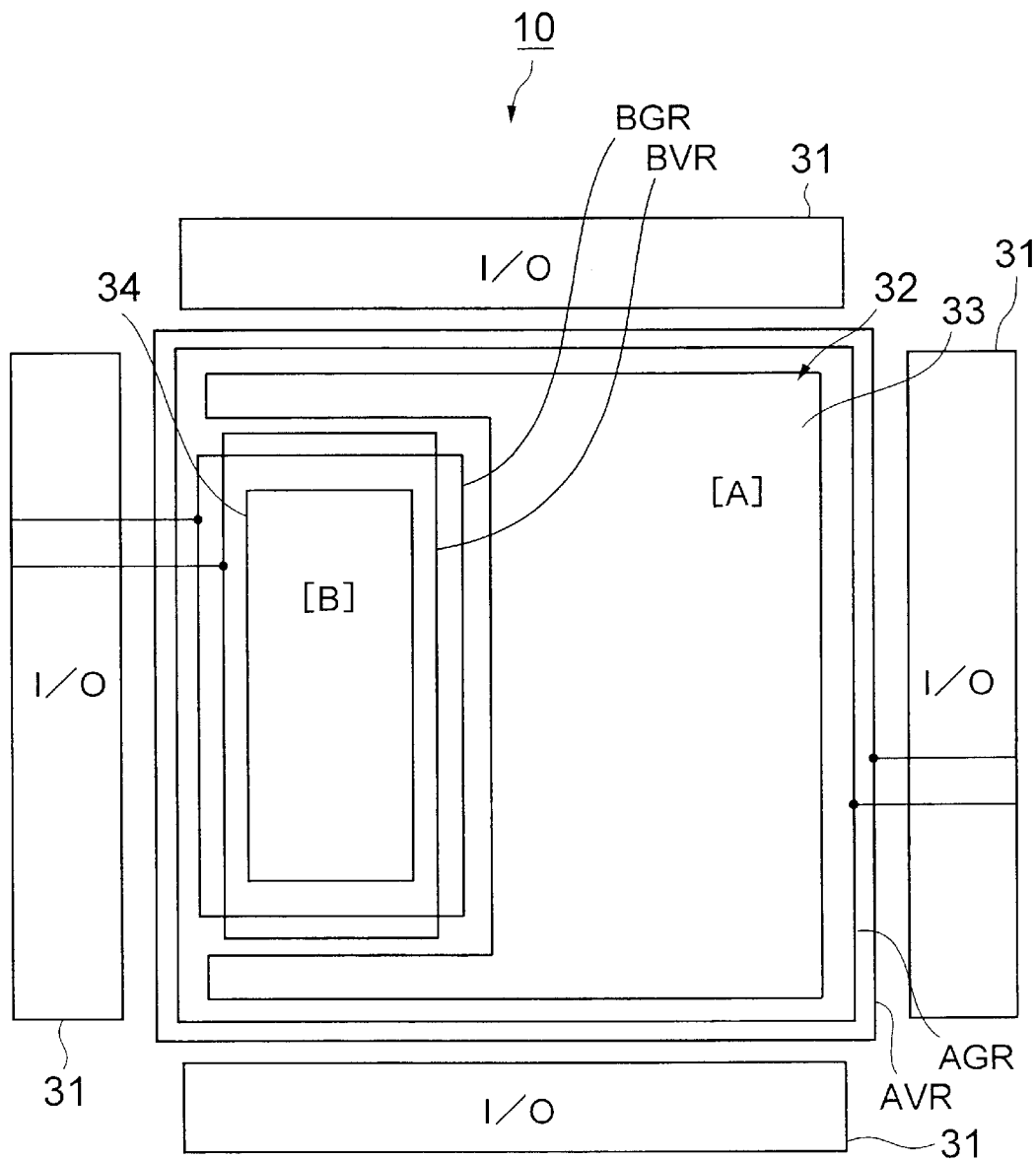

In step 317, the site definition of the area for the flexible macro block 34 is changed from the type "A" higher-integrated area to the type "B" higher-speed area. In step 318, higher-integrated functional cells and higher-speed functional cells are automatically or manually arranged in the type "A" area and the type "B" area, respectively, as shown in FIG. 18.

In step 319, the internal functional cells are automatically interconnected, followed by verification of the electric characteristics such as a timing characteristic in step 320 as to whether or not desired timings can be obtained. If the timing etc. characteristics of the chip pass the verification, the chip design is finished. On the other hand, the timing etc. characteristics do not pass the verification, the steps starting from step 312, 313 or 315 are iterated.

Figure 20:
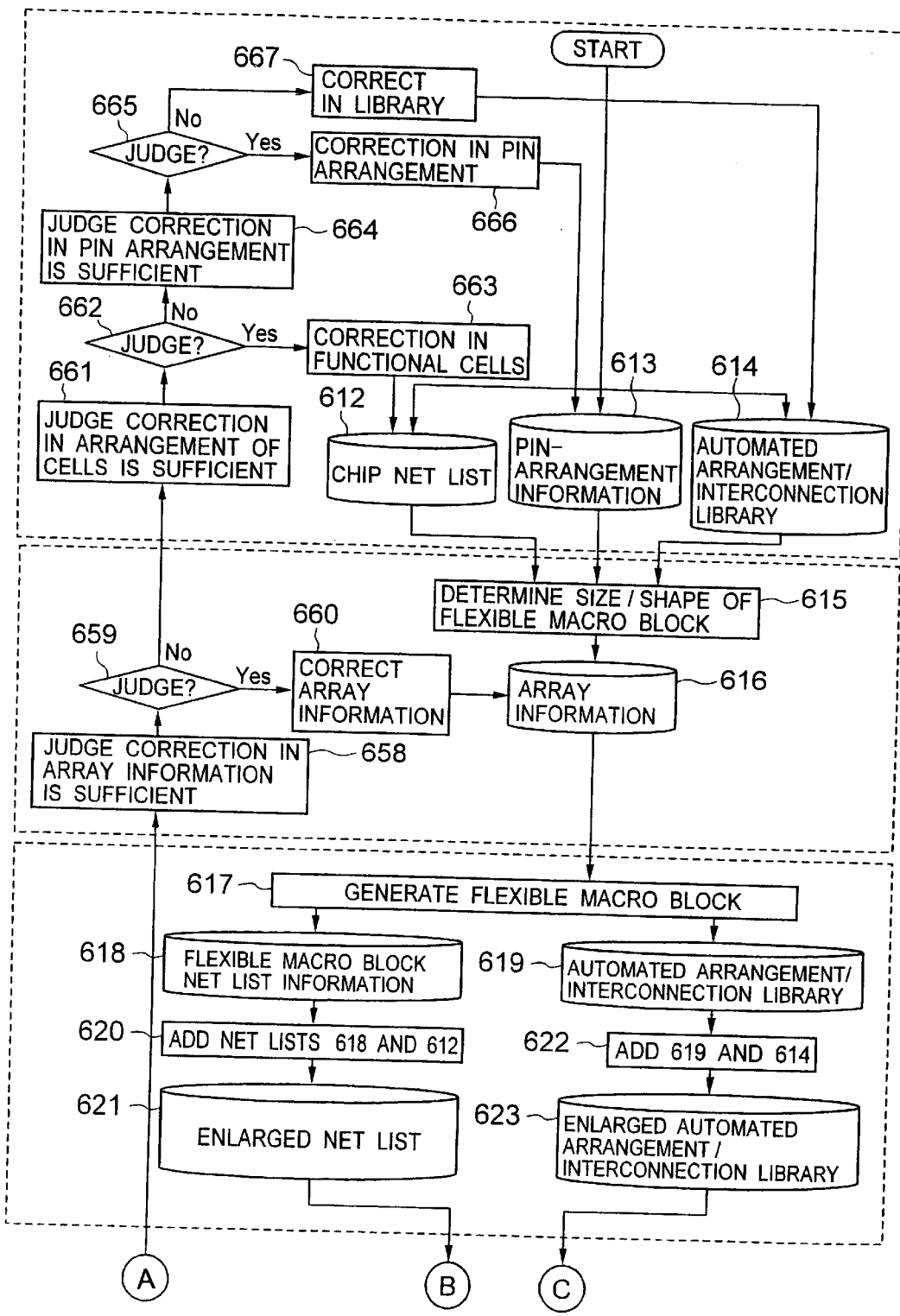
FIG. 20 is a part of a detailed flowchart of the chip design of FIG. 19.
Figure 21:
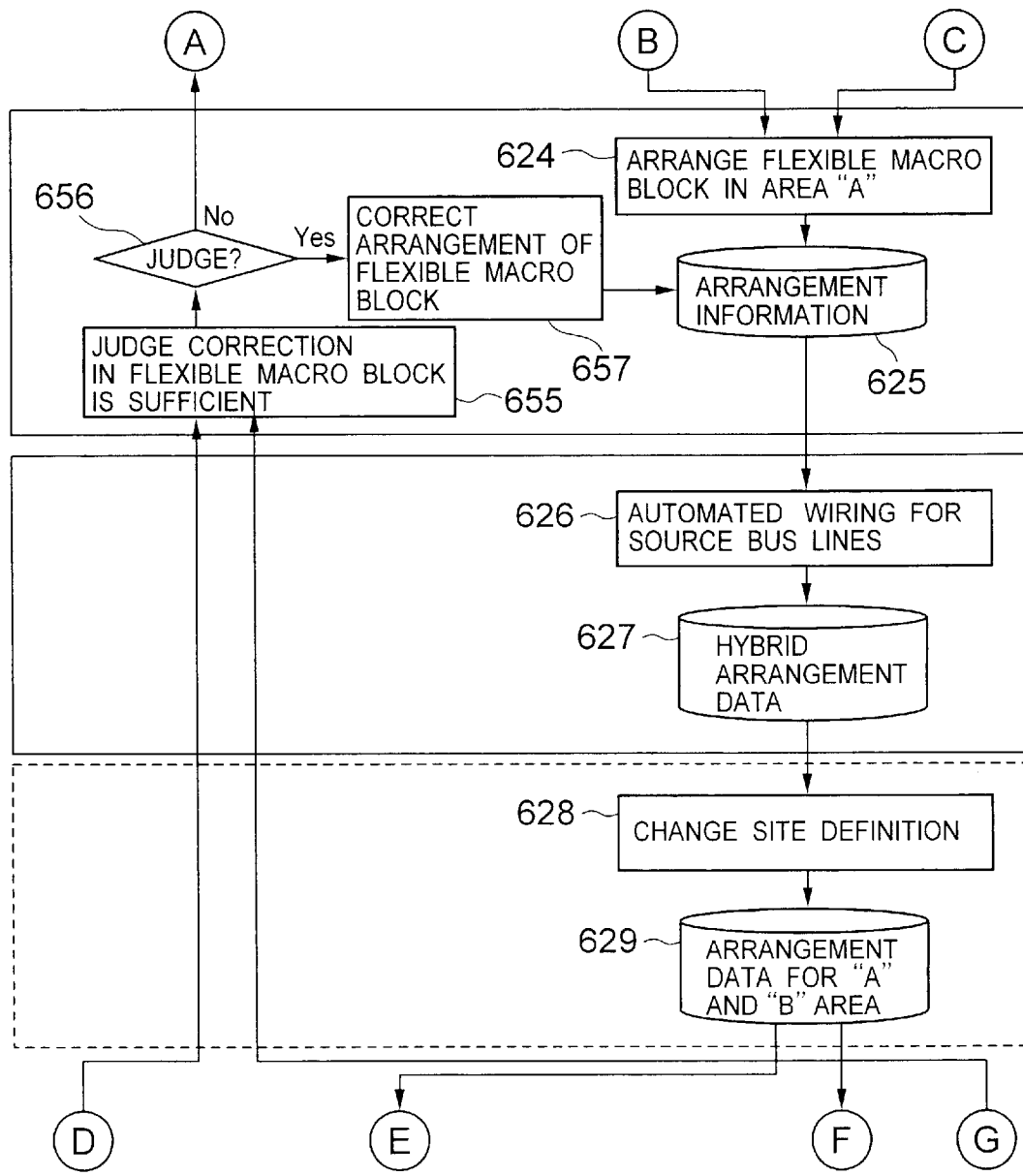
FIG. 21 is another part of the detailed flowchart of the chip design of FIG. 19.
Figure 22:
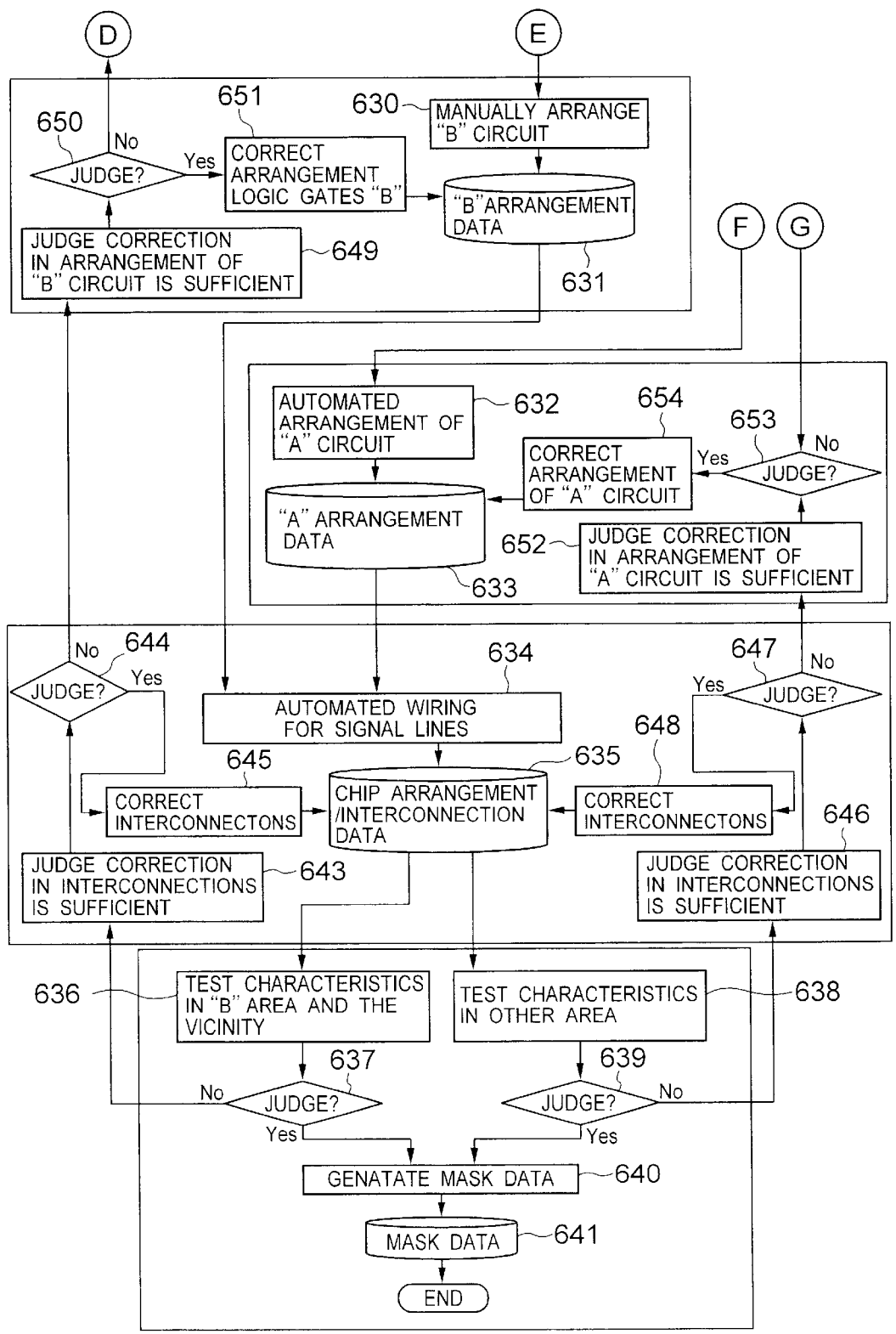
FIG. 22 is another part of the detailed flowchart of the chip design of FIG. 19.

FIGS. 20 to 22 show detailed steps for the process of FIG. 19. In FIG. 20, after the process starts, chip netlist information 612, pin-arrangement information 613 and automated arrangement/interconnection library 614 are input through the input section. In step 615, the size and the shape of the flexible macro block is automatically determined based on the recited information and library 612 to 614, to generate array information 616.

In next step 617, data for the flexible macro block is generated including netlist information 618 and automated arrangement/interconnection library 619 for the flexible macro block, whereby the process advances to steps 620 and 622. In step 620, netlist information 618 for the flexible macro block generated in step 617 is added to the chip netlist information 612 to generate enlarged netlist information 621 including the netlist for the chip and the flexible macro block.

In step 622, automated arrangement/interconnection information 619 for the flexible macro block is added to the automated arrangement/interconnection library 614 to generate enlarged arrangement/interconnection information 623 including arrangement/interconnection information for the chip and the flexible macro block. The steps 620 and 622 may be conducted concurrently or in the order reversed from the recited order.

In next step.624 of FIG. 21, the flexible macro block 34 is manually arranged in the internal cell area 32 which is occupied by the type "A" higher-integrated area 33 32, by using the chip arrangement/wiring tool based on the enlarged netlist 621 and the enlarged automated arrangement/interconnection library 623. Thus, the arrangement data 625 is generated which defines the locations of the higher-integrated area 33 and the flexible macro block 34, as shown in FIG. 16.

In next step 626, source bus lines (not shown) and ring source lines AGR, AVR, BGR and BVR are added to the arrangement data 625 by using the chip arrangement/wiring tool, as shown in FIG. 17, after inputting prohibition information which prohibits arrangement of the type "At logic cells and the type "B" logic cells in the vicinity of the flexible macro block 34. The prohibition information allows the source bus lines and ring source lines not to interfere with the internal source lines in both the higher-integrated circuit 33 and the higher-speed circuit 34.

Different types of the source lines are designed to be located inside the ring AGR line, between the ring BVR line and the ring BGR line, and inside the ring BVR and BOR lines. These source lines are automatically designed to pass on the unit grids which also define the locations of the basic cells.

Thus, the dedicated source bus lines and the dedicated ring source lines, arranged in both the higher-integrated area 33 and the higher-speed area 34, are added to the arrangement data 625 for the higher-integrated area 34 and the flexible macro block 34 to obtain hybrid arrangement data 627. If a simulation after the wiring step finds a defect in the ring source lines and source bus lines in some area, the defect can be corrected by correcting the ring source line or source bus line having the defect. This allows reasonable development of an optimum circuit arrangement for each of desired semiconductor devices.

In next step 628, the site conversion section 18 converts the area for the flexible macro bock 34 into the type "B" higher-speed area, as shown in FIG. 18, to obtain the data 629 for the type "A" higher-integrated area 33 and the type "B" higher-speed area 34. Then, the process advances to step 630 or 632 of FIG. 22. In step 630, type "B" logic gates are manually arranged in the type "B" higher-speed area 34 of the area data 629 to obtain "B" arrangement data 631 for the higher-speed area 33.

Assuming that the type "A" higher-integrated area 33 has an array of basic cells in the above steps 618 to 629, the CAD system 21 adds, to the site definition, description for the coordinates of the area wherein the flexible macro block 34 can be located, and then extracts the area for the flexible macro block 34 from the type "A" higher-integrated area 33. Subsequently, the site definition is changed in the description of the area for the flexible macro block 34, whereby type "B" basic cells can be arranged therein. Other area other than the area for the flexible macro block 34 remains to be the type "A" higher-integrated area for receiving type "A" basic cells.

Thus, not only the arrangement and the size of the type "B" basic cells are automatically determined in the area for the flexible macro block 34, but also the arrangement and the size of the type "A" higher-integrated area 33 and the type "B" higher-speed area 34 are determined by setting separate two type of library information by automated arrangement/wiring tool. After the arrangement and the size of the flexible macro block 34 is arbitrarily changed, the locations of the terminals for the flexible macro block are automatically corrected in accordance with the change in the arrangement and the size of the flexible macro block 34. Thus, an optimum arrangement of the terminals can be obtained at the boundary between the type "A" logic circuit 32 in the higher-integrated circuit area 33 and the type "B" logic circuit in the higher-speed area 34.

In the present embodiment, the unit grid used for locating the basic cell in the type "B" higher-speed area is set equal to or an integral multiple of the unit grid for the basic cell in the type a "A" higher-integrated area. This allows easy arrangement of the interconnections between the type "A" higher-integrated area and the type "B" higher-speed area. In addition, in an actual operation, the functional cell in the type "B" higher-speed area generally operates with a lower voltage amplitude whereas the functional cell in the type "A" higher-integrated area operates with a higher voltage amplitude which is equal to the source voltage. This necessitates provision of signal level converters at the boundary. The relationship in the unit grid between both the areas allows the input and output terminals of the level converters to be located aligned with the unit grids for both the areas by locating the level converters in accordance with the unit grid in the type "B" area. This allows alignment of the interconnections at the boundary between both the areas.

In step 632, type "A" logic gates are arranged in the higher-integrated area 33 of the area data 629 by using the chip automated arrangement/wiring tool to obtain "A" arrangement data 633 for the higher-integrated area 33. The order of the steps 630 and 632 can be reversed, or both the steps may be conducted concurrently.

In step 634, signal lines are arranged using the chip automated arrangement/wiring tool between the logic gates based on the "B" arrangement data 631 for the higher-speed area 33 and the "A" arrangement data 633 for the higher-integrated area 34, thereby generating the chip arrangement/interconnection data 635. Then, the process advances to step 636 or 638, wherein if it is judged that desired interconnections are not obtained by the automated wiring, the interconnections are corrected by the manual wiring function in the automated arrangement/wiring tool.

More specifically, in steps 636 and 637, it is judged whether or not desired timing etc. characteristics are obtained in the higher-speed area 34 and the adjacent region in the higher-integrated area 33 by using actual interconnections based on the chip arrangement/interconnection data 635. If the judgement is affirmative, the process advances to step 640, wherein mask data is generated based on the chip arrangement/interconnection data 635 to finish the chip design process. If the judgement is negative, it is judged in steps 643 and 644 whether or not correction in the interconnections is sufficient to obtain desired timing etc. characteristics.

On the other hand, in steps 638 and 639 following step 634, it is judged whether or not desired timing etc. characteristics are obtained by using actual interconnections based on the arrangement/interconnection data in the type "A" higher-integrated area. If the judgement is affirmative, the process advances to step 640 wherein mask data is generated based on the chip arrangement/interconnection data 635. If the judgement is negative, it is judged in steps 646 and 647 whether or not correction in the interconnections is sufficient to obtain desired characteristics. The order of steps 636 and 638 may be reversed or these steps may be conducted concurrently. In a preferred configuration, step 636 may be conducted first because step 636 involves a higher degree of evaluation.

In step 644, if the judgement is affirmative, the process advances.to step 645 wherein interconnections in the type "B" circuit area 34 are changed or corrected to iterate the steps starting from step 636. If the judgement is negative, it is further judged in steps 649 and 650 whether or not correction in the arrangement in the type "B" circuit area 34 is sufficient for obtaining desired characteristics.

On the other hand, if judgement is affirmative in step 647, the process advances to step 648 wherein interconnections in the type "A" circuit area 33 are corrected to iterate the steps starting from step 638. If the judgement is negative, it is further judged in steps 652 and 653 whether or not correction in the arrangement of the type "A" logic gates in the type "A" area is sufficient for obtaining the desired characteristics.

In step 650, if the judgement is affirmative, the process advances to step 651 wherein arrangement of the type "B" logic gates is corrected to iterate the steps starting from step 634. If the judgement is negative, it is judged in steps 655 and 656 of FIG. 21 whether or not correction in the arrangement of the flexible macro block itself is sufficient for obtaining the desired characteristics. In this case, the type "B" higher-speed area 34 is reduced or increased in its size by changing the description using a software approach, with the number of the logic gates therein maintained. This allows the size of the type "B" higher-speed area 34 to be arbitrarily changed within the space of the type "A" higher-integrated area 33. That is, the arrangement and the number of the type "B" logic gates in the higher-speed area 34 are flexible, which allows the type "A" area to be flexible. The flexible arrangement reduces the design TAT of the embedded LSI.

On the other hand, in step 653 of FIG. 22, if it is judged that correction in the arrangement of the type "A" logic gates is sufficient, the process advances to step 654 wherein arrangement of the type "A" logic gates is corrected in the higher-integrated area to iterate the steps starting from step 634. If judgement is negative, the process advances to steps 655 and 656 of FIG. 21 wherein similar process is conducted.

In step 656, if it is judged that correction of the flexible macro block is sufficient for obtaining the desired characteristics, the process advances to step 657 wherein arrangement of the flexible macro block is corrected to iterate the steps starting from step 626. If the judgement is negative, it is further judged in steps 658 and 659 of FIG. 20 whether or not correction in the array information 616 is sufficient. If the judgement is affirmative, the process advances to step 660 wherein the array information 616 is corrected to iterate the steps starting from step 617. If the judgement is negative, it is judged in steps 661 and 662 whether or not correction in the chip netlist is sufficient.

In step 662, if it is judged that correction in the chip netlist is sufficient, the process advances to step 663 wherein the chip netlist 612 is changed to iterate the steps starting from step 615. If the judgement is negative, it is judged in steps 664 and 665 whether or not correction in the pin-arrangement information 613 is sufficient. If the judgement is affirmative, the process advances to step 666 wherein chip pin-arrangement information 613 is corrected to iterate the steps starting from step 615. If the judgement is negative, the process advances to step 667 wherein chip automated arrangement/interconnection library 614 is corrected to iterate the steps starting from step 615. Since the steps after step 643 is conducted for a correction purpose, the order of the steps is not limited to the order recited herein.

As described above, in the present embodiment, the flexible macro block having a flexible size and located within the higher-integrated area allows parallel design for the hardware macro block and the higher-integrated circuit, whereby the design TAT for the embedded LSI can be reduced. Alternatively, a flexible type "A" area may be arranged in a type "B" area which initially occupies the whole internal cell area.

Evaluation of the timing characteristic by using actual interconnections based on the arrangement/interconnection data and subsequent partial correction based on the evaluation allows reduction of a marginal for the entire internal cell area.

The adjustment of the locations of the terminals for the flexible macro block in accordance with the size change of the flexible macro block allows an optimum arrangement of the terminals at the boundary between the hardware macro block and the higher-integrated circuit.

Figure 23:
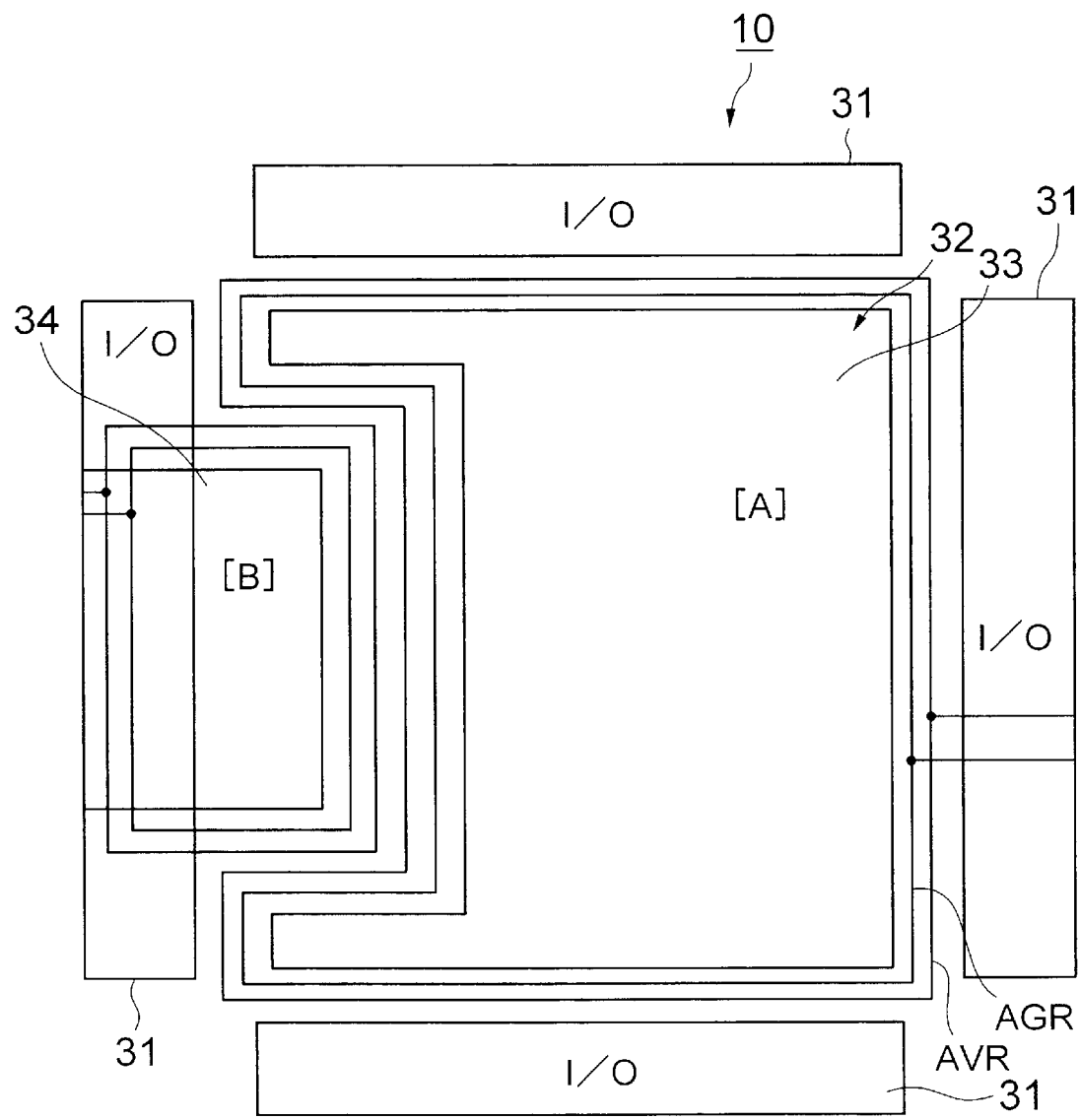
FIG. 23 is a top plan view of an example of a chip designed by the method of the embodiment.
Figure 24:
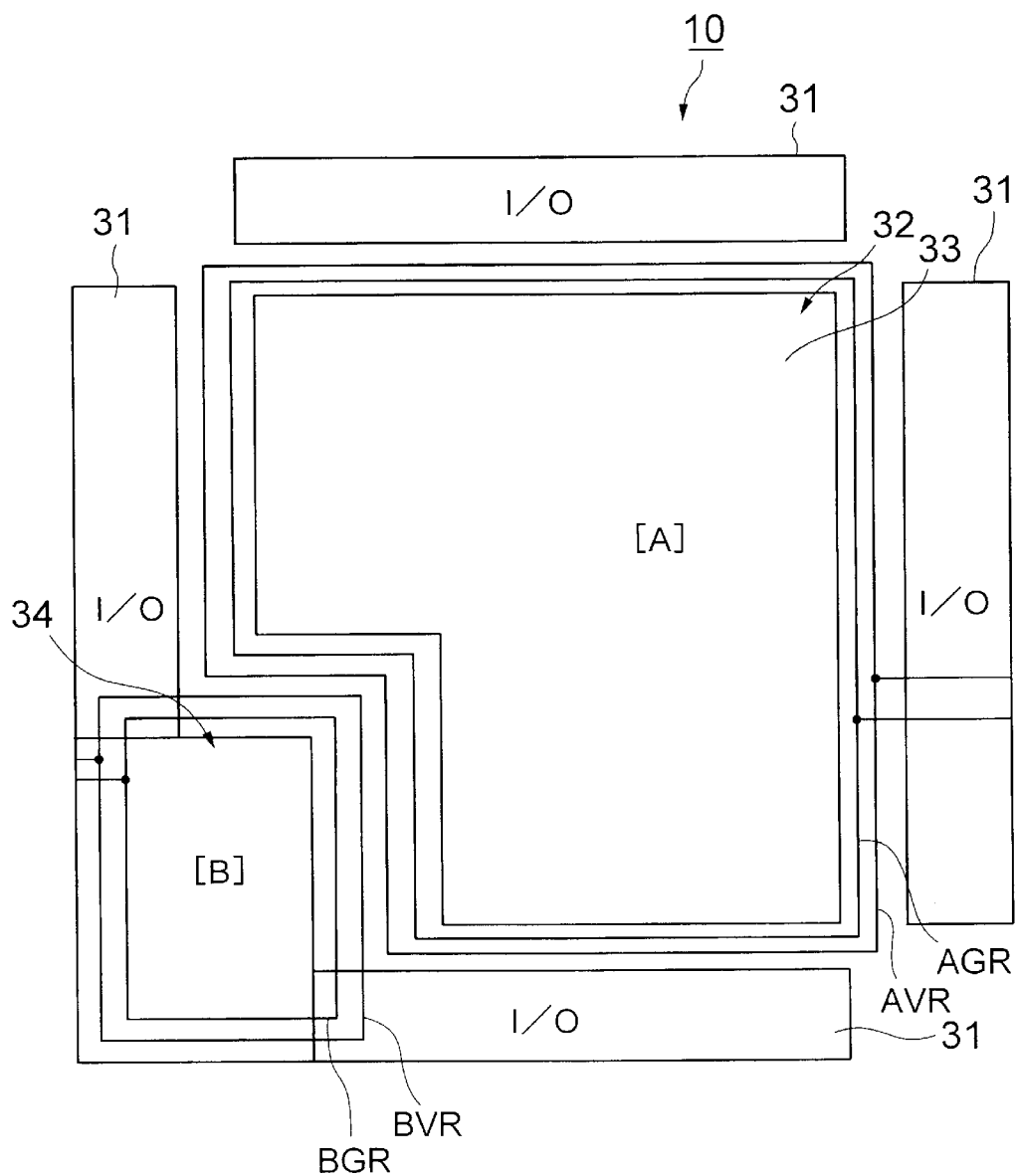
FIG. 24 is a top plan view of another example of a chip designed by the method of the embodiment.
Figure 25:
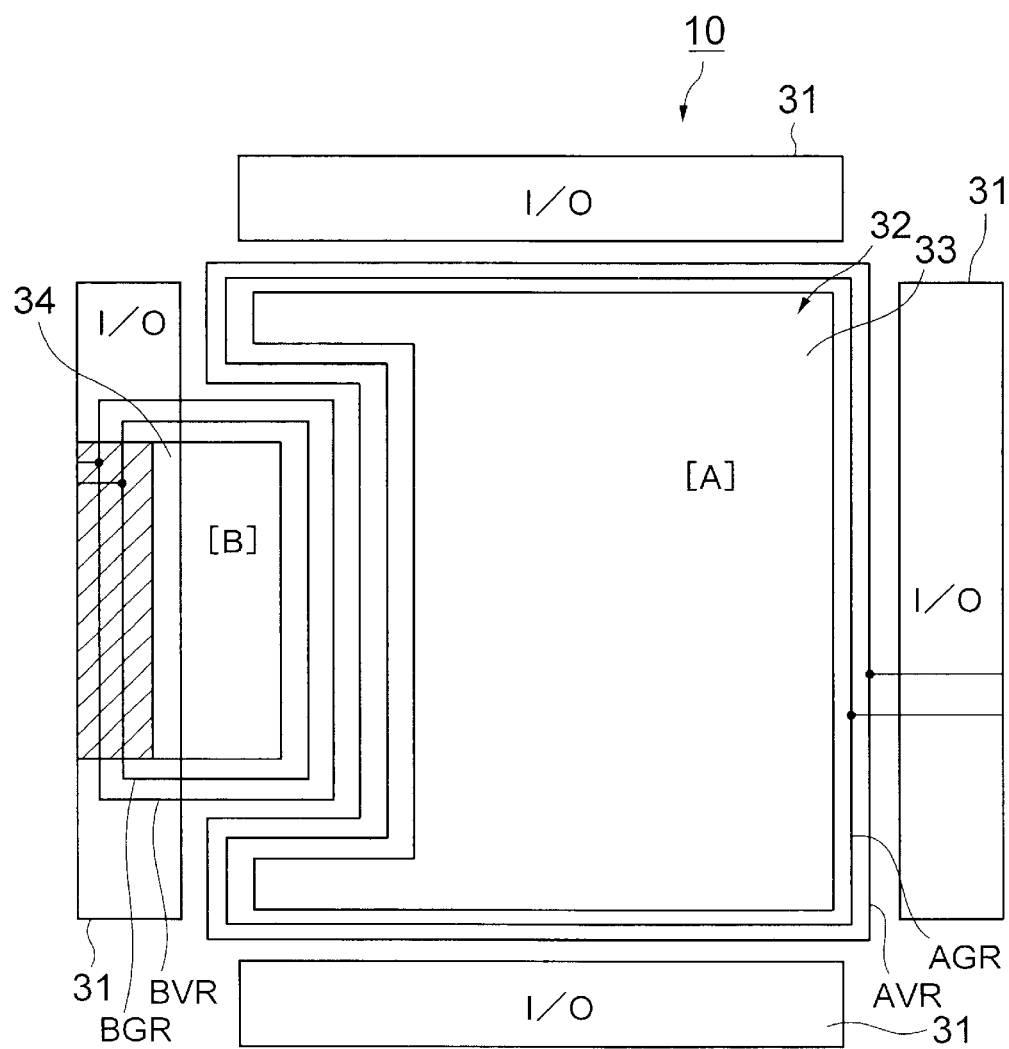
FIG. 25 is a top plan view of another example of a chip designed by the method of the embodiment.
Figure 26:
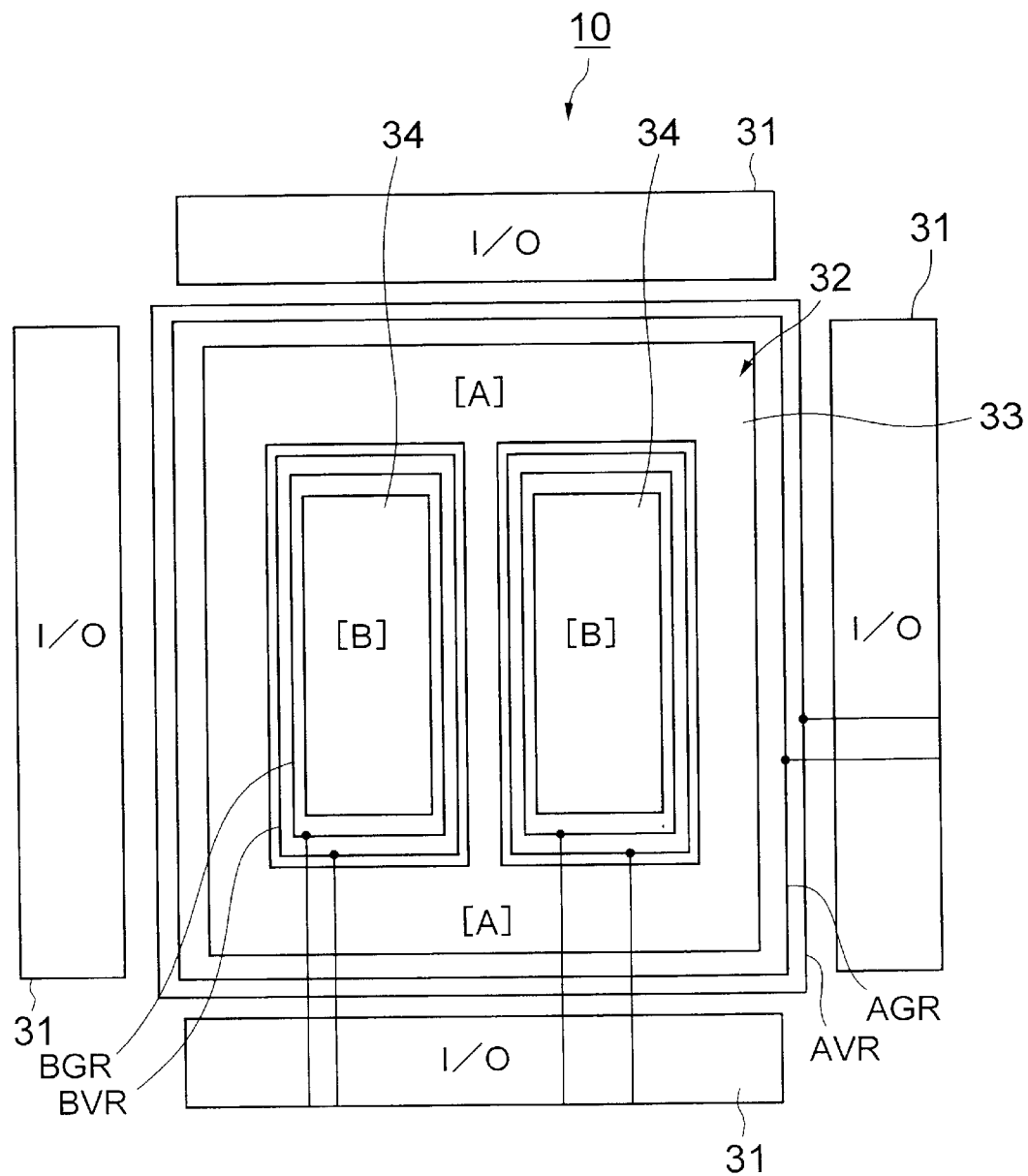
FIG. 26 is a top plan view of another example of a chip designed by the method of the embodiment.

In the above embodiment, the flexible macro block is located adjacent to one of the I/O cell area. However, the location of the flexible macro block 34 may be such that shown in FIG. 23, wherein a part of the hardware macro block 34 is disposed in one of the I/O cell areas 31. In a further alternative, the hardware macro block 34 may be disposed at a corner of the chip area as shown in FIG. 24, the hardware macro block 34 may have a dedicated I/O cell area as shown by hatching in FIG. 25, or a plurality of hardware macro blocks 34 may be disposed inside the higher-integrated area 33 as shown in FIG. 26.

Since the above embodiments are described only for examples, the present invention is not limited to the above embodiments and various modifications or alterations can be easily made therefrom by those skilled in the art without departing from the scope of the present invention.

What is claimed is:

1. A method for designing a large-scale integrated (LSI) circuit by using a computer-aided design (CAD) system, said method comprising:

defining an internal cell area on a chip, said internal cell area having a first site definition for receiving a first-type logic cells;

disposing a flexible macro block in a first area of said internal cell area based on flexible macro block information;

changing a site definition of said first area from said first site definition to a second site definition for receiving a second-type logic cells;

arranging respective logic cells in said first area for said flexible macro block and in a second area of said internal cell area in accordance with said second site definition and said first site definition, respectively;

interconnecting said respective logic cells to form a first circuit section and a second circuit section, respectively, in said first area and said second area;

evaluating electric characteristics of said first circuit section and said second circuit section; and separately correcting each of said first and said second circuit sections based on results of said evaluation and correction of the other of said first and second circuit sections.

2. The method as defined in claim 1, wherein the correction of said first circuit section includes correction of at least one of interconnections, arrangement of said logic cells and arrangement of said flexible macro block.

3. The method as defined in claim 2, wherein the correction of arrangement of said flexible macro block includes a change in a size of said flexible macro block.

4. The method as defined in claim 1, wherein said logic gate arranging and said interconnection locating are conducted using separate libraries for said first area and said second area.

5. The method as defined in claim 1, wherein said flexible macro block information includes at least one of a netlist, prohibition information for prohibiting arrangement of logic cells or interconnections, and a size of a respective cell.

6. The method as defined in claim 1, wherein a correction of the arrangement of said flexible macro block includes changing the site definition between said first site definition and said second site definition.

7. The method as defined in claim 1, wherein a unit grid defined by said second site definition is equal to or an integral multiple of a unit grid defined by said first site definition.

8. The method as defined in claim 1, wherein said first-type logic cells include higher-integrated logic gates, and said second-type logic cells include higher-speed logic gates or higher-resolution logic gates.

9. A method for designing a large-scale integrated (LSI) circuit by using a computer-aided design (CAD) system comprising:

defining an internal cell area on a chip, said internal cell area having a first site definition for receiving first-type logic cells, disposing a flexible macro block in a first area of said internal cell area based on flexible macro block information; and changing a site definition of said first area from said first site definition to a second site definition for receiving second-type logic cells.

10. The method of claim 9, further comprising:

arranging respective logic cells in said first area for said flexible macro block and in a second area of said internal cell area in accordance with said second site definition and said first site definition, respectively, and interconnecting said respective logic cells to form a first circuit section and a second circuit section, respectively, in said first area and said second area.

11. The method of claim 10, further comprising:

evaluating characteristics of said first circuit section and said second circuit section; and correcting each of said first and said second circuit sections based on results of said evaluation and correction of the other of said first and second circuit sections.

12. The method as defined in claim 11, wherein the correcting of said first circuit section includes correction of at least one of interconnections, arrangement of said logic cells and arrangement of said flexible macro block.

13. The method as defined in claim 12, wherein the correction of arrangement of said flexible macro block includes a change in a size of said flexible macro block.

14. The method as defined in claim 12, wherein said logic cell arrangement and said interconnection correction are conducted using separate libraries for said first area and said second area.

15. The method as defined in claim 9, wherein said flexible macro block information includes at least one of a netlist, prohibition information for prohibiting arrangement of logic cells or interconnections, and a size of a respective cell.

16. The method as defined in claim 12, wherein a correction of the arrangement of said flexible macro block includes changing the site definition between said first site definition and said second site definition.

17. The method as defined in claim 9, wherein a unit grid defined by said second site definition is equal to or an integral multiple of a unit grid defined by said first site definition, and wherein said first-type logic cells include higher-integrated logic gates, and said second-type logic cells include one of higher-speed logic gates and higher-resolution logic gates.

18. A method for designing a large-scale integrated (LSI) circuit by using a computer-aided design (CAD) system, comprising:

defining initially an internal cell area on a chip;

placing a flexible macro block in a first area having a first definition for a first type of cells;

redefining the first area as a second area for a second type of cells; and arranging the cells of both the first and second areas.

* * * * *